US008830859B2

United States Patent
Weng et al.

(10) Patent No.: US 8,830,859 B2
(45) Date of Patent: Sep. 9, 2014

(54) POWER BASED GAIN CONTROL ADJUSTMENT

(75) Inventors: Jianfeng Weng, Kanata (CA); Yangwen Liang, Waterloo (CA); Xing Qian, Conestogo (CA); Qing Feng Xu, Waterloo (CA); Christopher Eugene Snyder, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 172 days.

(21) Appl. No.: 13/468,411

(22) Filed: May 10, 2012

(65) Prior Publication Data

US 2013/0301428 A1 Nov. 14, 2013

(51) Int. Cl.
 *H04J 1/16* (2006.01)
 *H04W 52/52* (2009.01)

(52) U.S. Cl.
 CPC ..................... *H04W 52/52* (2013.01)
 USPC ............................ 370/252; 370/338; 370/509

(58) Field of Classification Search
 None
 See application file for complete search history.

(56) References Cited

U.S. PATENT DOCUMENTS

| | | | |
|---|---|---|---|
| 7,697,644 B2 | 4/2010 | Yousef et al. | |
| 7,822,153 B2 | 10/2010 | Song et al. | |
| 8,107,565 B2 | 1/2012 | Li et al. | |
| 2003/0091132 A1* | 5/2003 | Anderson | 375/345 |
| 2005/0221778 A1* | 10/2005 | Ishihara | 455/234.1 |
| 2008/0232518 A1* | 9/2008 | Kim et al. | 375/345 |
| 2008/0273636 A1 | 11/2008 | Zhu et al. | |
| 2009/0154617 A1 | 6/2009 | Jung et al. | |
| 2009/0310690 A1 | 12/2009 | Lee | |
| 2010/0158168 A1* | 6/2010 | Murthy et al. | 375/345 |
| 2010/0189188 A1 | 7/2010 | Li et al. | |
| 2010/0190459 A1 | 7/2010 | Li et al. | |
| 2010/0272219 A1 | 10/2010 | Andgart et al. | |
| 2011/0134980 A1* | 6/2011 | Lipka et al. | 375/224 |
| 2011/0150152 A1 | 6/2011 | Challa et al. | |

* cited by examiner

*Primary Examiner* — Ian N Moore
*Assistant Examiner* — Eric P Smith

(57) ABSTRACT

Method and devices for use in a wireless device are described herein. A signal is received over a plurality of time segments, the signal over each time segment including a plurality of resource element blocks. For each time segment, at least one resource element block is selected from the plurality of resource element blocks of the time segment based on information determined about the time segment. For each time segment, a power value associated with the at least one resource element block of the time segment is determined. For each time segment, a gain adjustment value to adjust the gain of the time segment or one or more subsequent time segments of the signal is determined based upon the power value associated with the at least one resource element block.

20 Claims, 9 Drawing Sheets

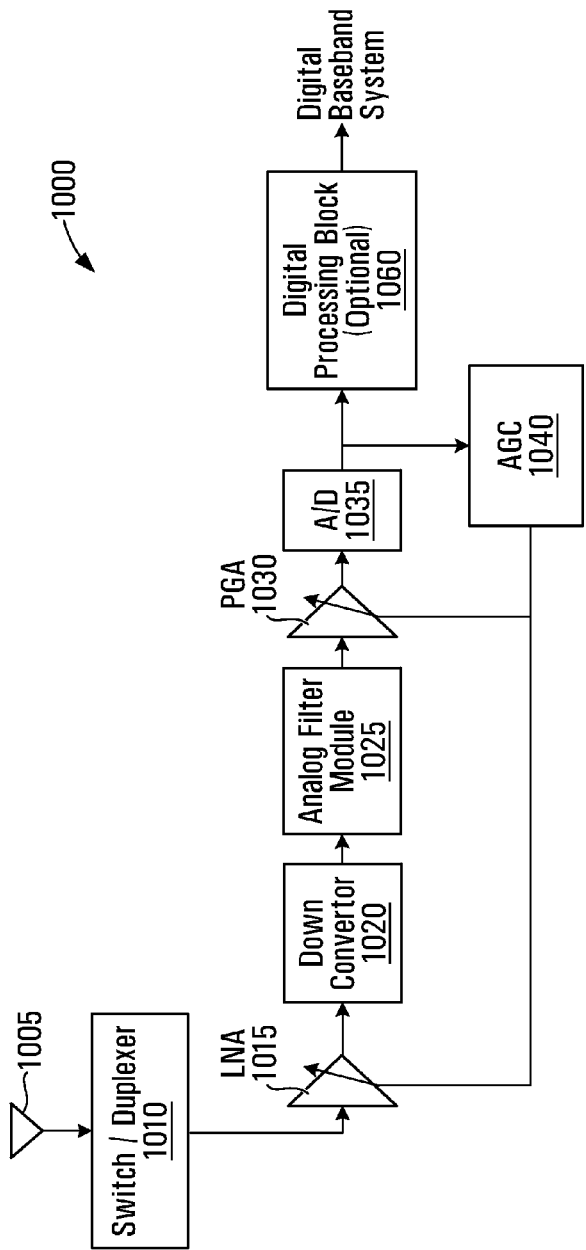
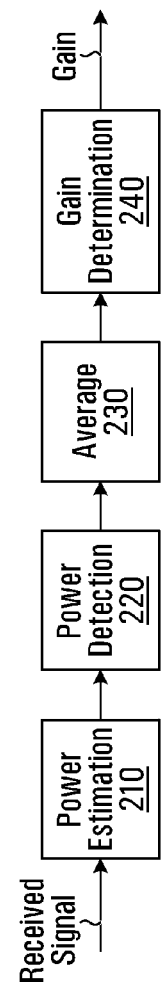
FIG. 1
FIG. 2

POWER BASED GAIN CONTROL ADJUSTMENT

TECHNICAL FIELD

The application relates to gain control in radio frequency receivers.

BACKGROUND

The power level of a received signal at a user equipment (UE), for example a wireless communication device, operating in a cellular network depends on the location of the UE in a cell, the propagation channel from a base station to the UE, and downlink resource allocation performed by the base station. As such, a power level of the received signal may vary over a wide range. At the UE, to adjust gains in an RF front-end sub-system of the UE for best reception of the received signal, an automatic gain control (AGC) controller is used.

A typical AGC implementation example is shown in the front-end sub-system 1000 of FIG. 1. FIG. 1 illustrates an antenna 1005, a switch/duplexer 1010, a low noise amplifier (LNA) 1015, a down converter 1020, an analog filter module 1025, a programmable gain amplifier (PGA) 1030, analog to digital converter (A/D) 1035, an optional digital processing block 1060, and an AGC module 1040.

The switch/duplexer 1010 receives a signal from antenna 1005 and acts like a band pass filter to filter out the signal in a passband of interest. The LNA 1015 amplifies the received signal and is controlled in part by the AGC 1040. The down-converter 1020 is followed by the analog filter module 1025, which in combination convert the received signal to a baseband signal. The PGA 1030 may be used to amplify the baseband signal and is controlled in part by the AGC 1040. The LNA 1015 and PGA 1030 are used to adjust the received signal power level. The AGC 1040 calculates gains for the LNA 1015 and the PGA 1030. The A/D 1035 samples the baseband analog signal that is output from the PGA 1030 and represents each sample as a discrete value to be passed to the digital baseband system for further processing. The output from the A/D 1035 is also used by the AGC 1040 to generate gain values. An optional digital processing block 1060, including filtering and amplification, can be performed on the A/D output before sending it to the digital baseband system.

The AGC 1040 functions similarly to a generic AGC module. An example of the elements of a generic AGC module 200 is illustrated in FIG. 2. FIG. 2 shows a received signal input to a first processing block 210 for performing time-domain power estimation. The output of first processing block 210 is provided to a second processing block 220 for performing power detection. The output of second processing block 220 is provided to a third processing block 230 for performing averaging. The output of third processing block 230 is provided to a fourth processing block 240 for performing gain determination.

The first processing block 210 performs power estimation by estimating a short-term power from received samples $\{x(p)\}$. For example, if an observation time of interval n is considered, an averaged power can be given by $$P_{avg}(n) = \frac{1}{N}\frac{1}{2}\sum_{p=0}^{N-1}|x(nN+p)|^2 \tag{1}$$

where ½ is a scaling factor for complex-valued samples and N is the number of samples in each observation time interval.

The second processing block 220 performs power detection by determining the power to be used in the third processing block 230. The detected power could be a peak power from several short-term power estimates or simply an average power of those. As an example, the power is set to an averaged power given by $$P(n) = P_{avg}(n) \tag{2}$$

The third processing block 230 performs a relatively long-term power average. Implementing the long-term power average may be implemented by a simple first order infinite impulse response (IIR) filter. In particular, an averaged power $\overline{P}(n)$ for time interval n can be expressed as, $$\overline{P}(n) = \alpha\overline{P}(n-1) + (1-\alpha)P(n) \tag{3}$$

where P(n) is the detected power from time interval n and α a forgetting factor. The power average shown above may be processed in dB values.

The fourth processing block 240 performs a comparison between the averaged power and a target power level and determines a gain adjustment for the next time interval. As an example, the gain adjustment for time interval n+1 may be given by $$\Delta g(n+1)\text{dB} = \mu \cdot [P_{target}\text{dB} - \overline{P}(n)\text{dB}] \tag{4}$$

where $\mu \in (0,1]$ is a step size and $P_{target}$ is the target power level.

The AGC in a conventional receiver may be implemented in a radio frequency integrated circuit (RFIC) or a baseband integrated circuit (BBIC). If the AGC is implemented in RFIC, this may provide a quick control on the various gains in the RF front-end subsystem. However, the BBIC may still control and provide to the RFIC, the forgetting factor and the target power level.

Commonly, time-domain power based AGC controllers are used in mobile stations. As time-domain power measurements are susceptible to the receive power variation caused by dynamic downlink resource allocations, the resulting AGC gain may change frequently with dynamic downlink resource allocations even in a slowly time-varying channel. Frequent AGC gain changes will degrade the receiver performance.

BRIEF DESCRIPTION OF THE DRAWINGS

Embodiments of the application will now be described with reference to the attached drawings in which:

FIG. 1 is an example of a receiver block diagram with a receiver automatic gain control (AGC) controller;

FIG. 2 is an example of a generic receiver AGC controller function block diagram;

DETAILED DESCRIPTION

Figure 3:
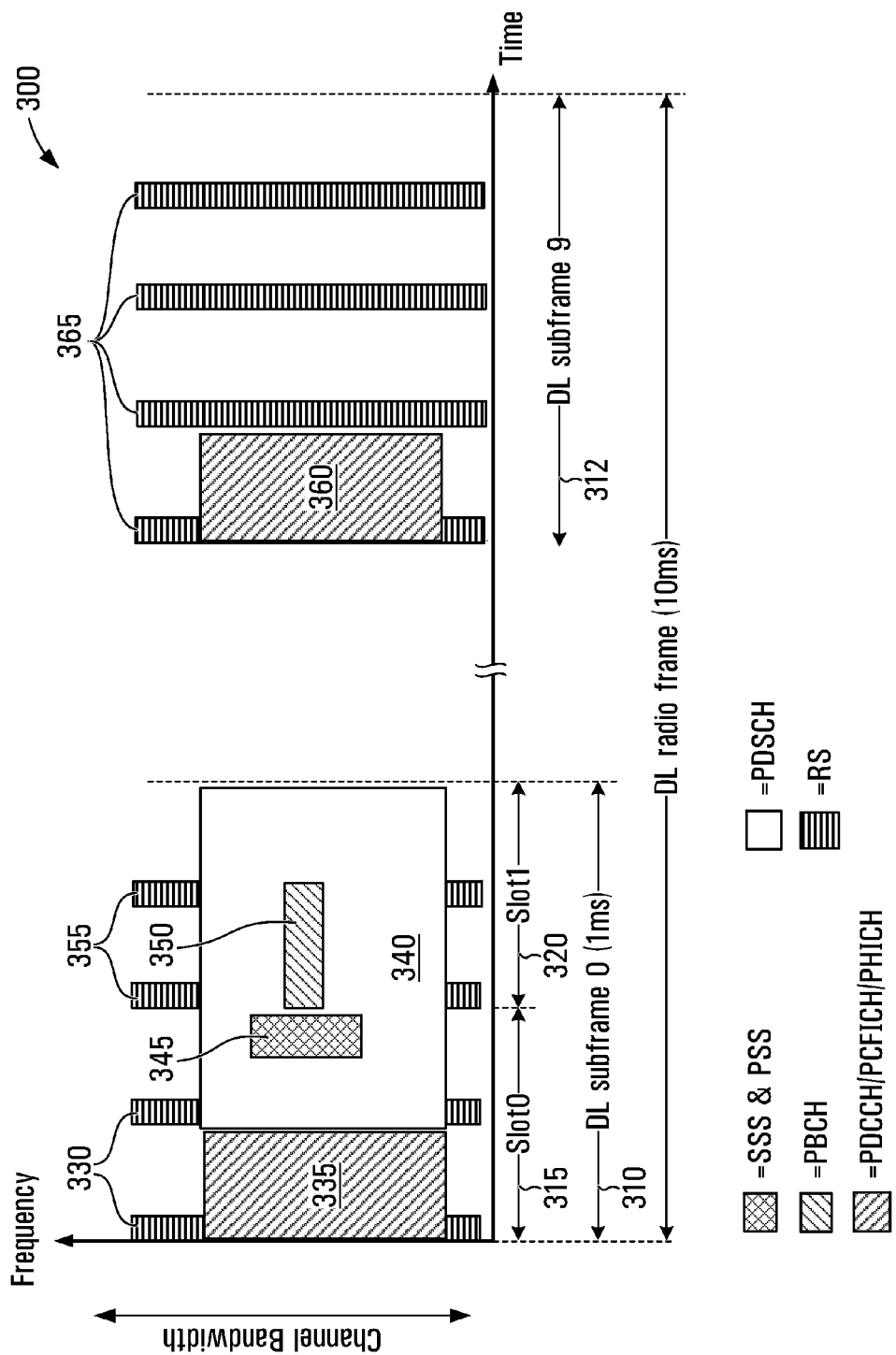
FIG. 3 is an example of a downlink (DL) transmission resource transmitted from one antenna within one radio frame.

According to an aspect of the present application there is provided a method for use in a receiver comprising: receiving a signal over a plurality of time segments, the signal over each time segment comprising a plurality of resource element blocks; for each time segment: selecting at least one resource element block from the plurality of resource element blocks of the time segment based on information determined about the time segment; determining a power value associated with the at least one resource element block of the time segment; and determining a gain adjustment value to adjust the gain of the time segment or one or more subsequent time segments based upon the power value associated with the at least one resource element block.

In some embodiments the signal over each time segment comprises a plurality of orthogonal frequency division multiplexing (OFDM) symbols, each resource element block comprises a plurality of resource elements and each resource element comprises an OFDM symbol duration on an OFDM subcarrier.

In some embodiments the method further comprises converting the signal from time domain into frequency domain.

In some embodiments determining the power value associated with the resource element block of the time segment comprises: for each of the at least one resource element block: measuring the power of each resource element of the resource element block; and determining an average power value per resource element for the resource element block by averaging the powers of the resource elements within the resource element block; and determining the power value associated with the at least one resource element block by averaging all of the average power per resource element values for the at least one resource element block within the time segment.

In some embodiments determining the power value associated with the at least one resource element block further comprises determining if each of the at least one resource element blocks is an occupied resource element block by comparing the average power value per resource element for the resource element block to a threshold that defines an occupied resource element block; and if the average power value per resource element for a resource element block is less than the threshold, not including the resource element block in the average when determining the power value.

In some embodiments determining the power value associated with the at least one resource element block of the time segment comprises determining the power value when the at least one resource element block is a portion of one of: one or more pilots, a physical downlink control channel (PDCCH); a physical downlink shared channel (PDSCH); a physical control format indicator channel (PCFICH); a primary synchronization channel (PSS); a secondary synchronization channel (SSS); and a physical broadcast channel (PBCH).

In some embodiments the method further comprises determining information about the time segment by decoding physical control format indicator channel (PCFICH) information to determine how many OFDM symbol durations are carrying physical downlink control channel (PDCCH) information.

In some embodiments the method further comprises, based on the PDCCH information, determining where physical downlink shared channels (PDSCH) are located in the time segment.

In some embodiments the method further comprises determining information about the time segment by: determining if there is any physical downlink shared channel (PDSCH) information for the receiver in the time segment; if there is PDSCH information for the receiver, determining the location of the PDSCH information in the time segment; and if there is no PDSCH information for the receiver and the receiver is configured to temporarily shut down if no PDSCH information is detected, determining how many resource elements in the resource element block are available for power measurement before the receiver temporarily shuts down for at least a remainder of the time segment.

In some embodiments the method further comprises, if there is no PDSCH information for the receiver and if the resource element block for which the power value is to be determined is the PDSCH; for each of the at least one resource element block available for power measurement: measuring the power of each resource element of the resource element block; and determining an average power value per resource element for the resource element block by averaging the powers of the resource elements within the resource element block; and determining if the resource element block is an occupied resource element block by comparing the average power value per resource element for the resource element block to a threshold that defines an occupied resource element block; and determining the power value for the at least one resource element block by averaging all of the average power per resource element values for the at least one resource element block within the time segment.

In some embodiments selecting the at least one resource element block from the plurality of resource element blocks comprises: for each time segment, determining how many resource elements in the resource element block are available for power measurement.

In some embodiments the signal is a long term evolution (LTE) signal.

In some embodiments determining the gain adjustment value further comprises determining a target power level based on Doppler frequency estimate and comparing the power level with the target power level for the gain adjustment.

In some embodiments determining a target power level based on Doppler frequency estimate further comprises setting the target power level to a first value if the Doppler frequency estimate is equal to or less than a Doppler frequency estimate threshold and setting the target power level to a second value if the Doppler frequency estimate is large than the Doppler frequency estimate threshold.

According to another aspect of the present application there is provided a wireless device comprising a receiver, the wireless device comprising: a processor; a gain adjustment function configured to: receive a signal over a plurality of time segments, the signal over each time segment comprising a plurality of resource element blocks; for each time segment: select at least one resource element block from the plurality of resource element blocks of the time segment based on information determined about the time segment; determine a power value associated with the at least one resource element block of the time segment; and determine a gain adjustment value to adjust the gain of the time segment or one or more subsequent time segments based upon the power value associated with the at least one resource element block.

In some embodiments the signal over each time segment comprises a plurality of orthogonal frequency division multiplexing (OFDM) symbols, each resource element block comprises a plurality of resource elements and each resource element comprises an OFDM symbol duration on an OFDM subcarrier.

In some embodiments the gain adjustment function is further configured to convert the signal from time domain into frequency domain.

In some embodiments the gain adjustment function is further configured to: for each of the at least one resource element block: measure the power of each resource element of the resource element block; and determine an average power value per resource element for the resource element block by averaging the powers of the resource elements within the resource element block; and determine the power value associated with the at least one resource element block by averaging all of the average power per resource element values for the at least one resource element block within the time segment.

In some embodiments the gain adjustment function is further configured to: when determining the power value associated with the at least one resource element block, determine if each of the at least one resource element blocks is an occupied resource element block by comparing the average power value per resource element for the resource element block to a threshold that defines an occupied resource element block; and if the average power value per resource element for a resource element block is less than the threshold, not include the resource element block in the average when determining the power value.

In some embodiments the gain adjustment function is further configured to determine the power value when the at least one resource element block is a portion of one of: one or more pilots; physical downlink control channel (PDCCH); a physical downlink shared channel (PDSCH); a physical control format indicator channel (PCFICH); a primary synchronization channel (PSS); a secondary synchronization channel (SSS); and a physical broadcast channel (PBCH).

In some embodiments the gain adjustment function is further configured to determine information about the time segment by decoding physical control format indicator channel (PCFICH) information to determine how many OFDM symbol durations are carrying physical downlink control channel (PDCCH) information.

In some embodiments the gain adjustment function is further configured to, for each time segment, based on the PDCCH information, determine where physical downlink shared channels (PDSCH) are located in the time segment.

In some embodiments the gain adjustment function is further configured to, for each time segment determine information about the time segment such that the gain adjustment function is configured to: determine if there is any physical downlink shared channel (PDSCH) information for the wireless device in the time segment; if there is PDSCH information for the wireless device, determine the location of the PDSCH information in the time segment; and if there is no PDSCH information for the wireless device and the wireless device is configured to temporarily shut down if no PDSCH information is detected, determine how many resource elements in the resource element block are available for power measurement before the wireless device temporarily shuts down for at least a remainder of the time segment.

In some embodiments wherein if there is no PDSCH information for the wireless device and if the at least one resource element block for which the power value is to be determined is the PDSCH, the gain adjustment function is configured to: for each of the at least one resource element block available for power measurement: measure the power of each resource element of the resource element block; and determine an average power value per resource element for the resource element block by averaging the powers of the resource elements within the resource element block; determine if the resource element block is an occupied resource element block by comparing the average power value per resource element for the resource element block to a threshold that defines an occupied resource element block; and determine the power value for the at least one resource element block by averaging all of the average power per resource element values for the at least one resource element block within the time segment.

In some embodiments the gain adjustment function is further configured to, for each time segment, determine how many resource elements in the resource element block are available for power measurement.

In some embodiments the gain adjustment function is further configured to determine a target power level based on Doppler frequency estimate and comparing the power level with the target power level for the gain adjustment.

In some embodiments the gain adjustment function is further configured to set the target power level to a first value if the Doppler frequency estimate is equal to or less than a Doppler frequency estimate threshold and set the target power level to a second value if the Doppler frequency estimate is large than the Doppler frequency estimate threshold.

According to another aspect of the present application there is provided a gain control controller configured to: receive a signal over a plurality of time segments, the signal over each time segment comprising a plurality of resource element blocks; for each time segment: select at least one resource element block from the plurality of resource element blocks of the time segment based on information determined about the time segment; determine a power value associated with the at least one resource element block of the time segment; and determine a gain adjustment value to adjust the gain of the time segment or one or more subsequent time segments of the signal based upon the power value associated with the at least one resource element block.

Many of the example embodiments described herein pertain to the third generation partnership project (3GPP) long term evolution (LTE), also known as Evolved Universal Terrestrial Radio Access (E-UTRA). However, solutions described herein may be applicable to any radio access technology where some form of receive AGC in an operating band with multiple channels and multiple channel bandwidths is utilized. As such, the solutions would be applicable to, but not limited to, technologies such as: LTE/E-UTRA, CDMA and WiMAX. Furthermore, while many of the examples described herein pertain to wireless devices, either fixed or mobile, the subject matter described herein may also be equally applicable to some forms of wireline communications.

While reference is made below to an E-UTRA UE, it is to be considered that more generally a UE can be a wireless communication device that is compatible with other non-E-UTRA communication systems. The UE may be, but is not limited to, a fixed or mobile wireless terminal, a cellular telephone, a wirelessly enabled computer, a wirelessly enabled gaming machine and a personal data assistant (PDA).

Many of the example embodiments described herein pertain to, in LTE, converting a signal from the time domain to the frequency domain and performing further analysis in the frequency domain. However it is also possible that instead of converting a signal into the frequency domain, a time domain signal could be converted into an alternative domain, such as for example a "code domain" in CDMA, to avoid problems that arise from time domain processing that could result in inaccurate power determination for gain calculations.

E-UTRA supports six different size channel bandwidths. A list of supported channel bandwidths and transmission bandwidth configuration number of resource blocks (NRB) are tabulated in Table 1 below. In Table 1, "Channel bandwidth" is the size of a channel including portions that can be occupied and portions that act as guard bands, "Transmission bandwidth configuration NRB" is the maximum number of resource blocks in the occupied portion of the transmission bandwidth, and "Transmission bandwidth" is a portion of the channel bandwidth that is occupied, up to a maximum of the channel bandwidth minus any guard band portions. The contents of Table 1 are purely an exemplary list of bandwidths and it is to be understood that the methodologies described herein could apply to any reasonable number and size of bandwidths with distinct bandwidth values.

In a particular implementation of E-UTRA a resource block (RB) is a block of 12 consecutive subcarriers over at least a portion of a time slot or a subframe. More generally, an RB is a group of physically adjacent subcarriers. In E-UTRA one time slot equals 0.5 ms and a subframe equals 1.0 ms for example. Further details on the definition of RB and subcarriers for a given implementation can be found in 3GPP TS 36.211 "$3^{rd}$ Generation Partnership Project; Technical Specification Group Radio Access Network; Evolved Universal Terrestrial Radio Access (E-UTRA); Physical channels and modulation (Release 8)".

TABLE 1

E-UTRA channel bandwidths and transmission bandwidth configuration NRB

| Channel bandwidth BWChannel [MHz] | 1.4 | 3 | 5 | 10 | 15 | 20 |
|---|---|---|---|---|---|---|
| Transmission bandwidth configuration NRB | 6 | 15 | 25 | 50 | 75 | 100 |
| Transmission bandwidth (MHz) | 1.08 | 2.7 | 4.5 | 9 | 13.5 | 18 |

E-UTRA is designed to operate in various operating bands from 700 MHz to 2.6 GHz as specified in 3GPP TS 36.101 "$3^{rd}$ Generation Partnership Project; Technical Specification Group Radio Access Network; Evolved Universal Terrestrial Radio Access (E-UTRA); User Equipment (UE) radio transmission and reception (Release 8)". The bandwidths of those operating bands may vary from 10 MHz to 100 MHz.

A base station in a telecommunication cell may transmit data over a two-dimensional transmission resource having a time dimension and a frequency dimension, which is divided into frames and subframes. The subframes may be further divided into time slots. More generally the frame, subframes and time slots could be referred to generically as time segments or tie portions of the two-dimensional transmission resource. The base station is termed as evolved base node (eNB) in 3GPP E-UTRA. Within each subframe, a subset of resource elements (RE) are selected to carry the reference signals. As an example one RE may refer to a time/frequency location of the two-dimensional transmission resource made up of one OFDM symbol duration in the time dimension transmitted on one subcarrier in the frequency dimension.

Multiple resource elements collectively will be referred to herein as a "resource element block". Therefore, a resource element block is a portion of the two-dimensional transmission resource that is at least one OFDM subcarrier by at least two OFDM symbol durations or at least two contiguous, or physically adjacent, OFDM subcarriers by at least one OFDM symbol duration.

Within the frames and subframes, the eNB may transmit a set of synchronization signals, such as primary synchronization signal (PSS) and secondary synchronization signal (SSS), which are broadcast on a regular basis. Such synchronization signals can be used by a wireless device when performing cell selection and re-selection so as to synchronize the timing of the wireless device with the network. In some implementations the number of PSS/SSS resource elements carrying PSS and SSS does not change for each occurrence and the occurrence of PSS and SSS is periodic, for example once every 5 subframes.

Within the frames and subframes, the eNB may transmit a physical broadcast channel (PBCH) to broadcast basic system information about the cell. In some implementations the number of PBCH resource elements used in the subframe carrying PBCH does not change for each occurrence. The occurrence of PBCH is periodic in the frame, for example, once every 10 subframes.

Within the frames and subframes, the eNB may transmit a physical HARQ indicator channel (PHICH) to transmit UE-specific ACKnowledge (ACK) or negative ACK (NAK) information for the hybrid automatic repeat request (HARQ) scheme. In some implementations the number of PHICH resource elements used in each subframe may change from one subframe to another.

Within the frames and subframes, the eNB may transmit a physical downlink control channel (PDCCH) to transmit information regarding allocation of bandwidth between the cell and UEs the cell is communicating with. PDCCH has multiple control channel elements (CCE), one or more for each of multiple UEs that the cell may be communicating with. If a UE can decode the PDCCH CCE, the success of the decoding can be determined based on a cyclic redundancy check (CRC) pass, the UE can assume there is a PDCCH allocated for the UE. This may be useful in the sense that it may allow the UE to determine if at least some PDSCH resource element blocks are allocated for the UE and that the PDSCH resource elements in those resource element blocks are therefore fully occupied. Those fully occupied PDSCH resource elements can be used for power measurements.

Within the frames and subframes, the eNB may transmit a physical control format indicator channel (PCFICH) to indicate the size of the PDCCH, i.e., the number of OFDM symbols within the current subframe carrying the PDCCH. In some implementations the number of PCFICH resource elements used in each subframe does not change on a subframe to subframe basis.

Within the frames and subframes, the eNB may transmit a physical downlink shared channel (PDSCH) to transmit data to devices the cell is transmitting to. In some embodiments a "resource block" (RB) which defines a conventional transmission unit in the PDSCH in LTE is considered a resource element block as defined in the present application. The PDSCH has multiple RBs, which may be used for each of multiple UEs that the cell communicates with. In some implementations the RB are 12 subcarriers by a given number of OFDM symbols.

In some embodiments the resource element block may be a two dimensional resource that defines a channel other than the PDSCH within a subframe or a portion of a channel other than the PDSCH, such that, for example, an integer number of resource element blocks that define the channel.

Within the frames and subframes, the eNB may transmit a set of cell specific reference signals (RS), which are broadcast within the DL allocation bandwidth on a regular basis. Such reference signals may aid in the identification of the eNB and may aid in the downlink signal demodulation. These reference signals are also commonly known as pilot signals.

For broadcast downlink channel/signals, such as PCFICH, PBCH, reference signals, PSS, and SSS, their associated downlink power per RE may not vary over time since broadcast downlink channel/signals need to cover the cell being serviced by the eNB. For UE-specific downlink channels, such as PDCCH, PDSCH, and ACK/NAK in PHICH, their associated powers may be UE dependent and may vary over time. For example, the eNB may allocate more power to UE-specific downlink channels for UEs that are far away from the eNB while allocate less power to UE-specific downlink channels for UEs that are close to the eNB. During the allocation, the total power per symbol duration does not exceed the maximum mean transmit power.

It is well-known that at a UE, its received signal power (a time-domain signal power) is affected by channel attenuation and interference. In LTE, however, the time-domain signal power is also affected by downlink dynamic allocations since LTE downlink (DL) channels/signals from an eNB are not always transmitted and are time-varying. An example of a downlink (DL) transmission resource transmitted from one antenna within one radio frame is shown in FIG. 3.

FIG. 3 illustrates an example of a frequency division duplexing (FDD) DL radio frame 300 with multiple subframes, two of which, a first subframe 310 and a last subframe 312, being shown in detail. The DL radio frame 300 is shown to have a two dimensional format, having a given bandwidth in a frequency dimension and the multiple DL subframes 310,312, each made up of two slots 315,320, in the time dimension. The FDD DL radio frame 300 is comprised of multiple resource elements, which may be grouped into multiple resource element blocks. The slots 315,320 for example may be made up of multiple resource element blocks.

The first subframe 310 is a first subframe of ten subframes in the DL radio frame 300 and is comprised of two equal sized slots 315, 320. The first slot 315 includes multiple reference signals 330 and a portion of the first slot 315 contains the PDCCH, PCFICH and physical hybrid ARQ indication channel (PHICH) 335. Another portion of the first slot 315 is used for the PDSCH 340. A further portion of the first slot 315 is used for the PSS/SSS 345. The second slot 320 includes more of the PDSCH 340. Another portion of the second slot 320 is used for the PBCH 350. The second slot 320 also includes multiple reference signals 355.

The second subframe 312 in FIG. 3 shows the tenth subframe within the DL radio frame 300. Subframes 2 to 9 are not shown. In the particular example of FIG. 3, the tenth subframe is again comprised of two equal sized slots (not shown). A portion of the first slot includes PDCCH, PCFICH and PHICH 360. The remainder of the first and second slots of the tenth subframe are empty except for reference signals 365.

In some implementations, a DL radio frame may have the following channel/signal allocations. The pilots occur in each subframe. The PSS/SSS occurs in one or more respective channels in the first slot and the eleventh slot, i.e. the first slot of the fifth subframe (not shown) of each DL radio frame. The PBCH occurs in the second slot of each DL radio frame. The PDCCH, PCFICH and PHICH occur in the first 1 to 3 or 2 to 4 symbols of each subframe. The PDSCH occupies portions of the subframes that are not used by other channels and not reserved for other uses. It is possible that if there is no DL traffic then there will be empty portions of one or more subframes, as is evidenced by the tenth subframe 312 being empty other than for the PDCCH, PCFICH and PHICH 360 and reference signals 365.

DL radio frame 300 is an example of one of many such frames that may be communicated between a base station and one or more UEs. FIG. 3 is of course merely an example of a DL radio frame and the locations of channel and reference signals within the DL radio frame, allocation of signals within those channels and the number and size of subframes and slots is implementation specific.

Within one subframe, different channels/signals may be transmitted over different OFDM symbol durations. As such the transmit power may vary from one OFDM symbol duration to another. For example, from one subframe to another, PDSCH is not always utilized. Even if the PDSCH was constantly utilized, the number of PDSCH occupied resource element blocks may still vary with the number of UEs being served and the number of resource element blocks being allocated to each UE.

The above means the downlink signal from a base station has a bursty nature. As a result, a UE needs to handle the abrupt power variation not only due to multipath fading, but also due to the presence or absence of downlink channels/ signals from one subframe to another as the UE has little knowledge on what is going to happen in subsequent subframes.

In an OFDM system, when the number of occupied resource elements changes, the time-domain signal power level may change. However, that does not mean a gain adjustment is needed. Actually, in that case, the signal to quantization noise ratio (SQNR) for each occupied resource element remains almost at the same level even a change on the number of occupied resource elements causes a drop on the time-domain signal power level. That suggests the gain should not be adjusted with the number of occupied resource elements.

Several problems associated with time-domain power based AGCs are described below.

The time-domain signal power level may change abruptly due to dynamic downlink resource allocations. In LTE, as AGCs often use a power estimate up to the current subframe to set the AGC gains for the next subframe, an abrupt time-domain power increase in the next subframe may saturate the ADC and resulting signals may be severely distorted.

When averaged over time it is possible to set a forgetting factor so that the measured powers used in the AGC controller are derived over a long time period and an AGC adjustment value determined based on the measured powers will be insensitive to power change caused by downlink resource allocations. This is not a desired solution however as the long-term averaging means that the AGC adjustment value will also be less sensitive to the multipath fading variation or the propagation loss variation.

In some implementations of LTE, the AGC gain is adjusted at subframe boundaries to minimize the AGC gain impact on the received downlink signals. Also, once an AGC gain adjustment is applied at the beginning of a subframe, the gain may settle within a first cyclic prefix (CP) time interval of the subframe. However, in a fading channel with time spread comparable to the CP length, any gain change in the first CP may still affect the circular convolution property of the first OFDM symbol and ultimately affect the demodulation performance of the OFDM symbol.

When tracking channel variation in the BBIC, any AGC gain change in the RFIC is to be reversed back in the BBIC for demodulation to form a signal as if there were no gain change in the RFIC. Although the BBIC can import the AGC gain values from the RFIC, there is a gain inaccuracy (+/−0.5 dB as an example) between the imported quantized values and the actual AGC values being applied in the RFIC. The gain inaccuracy means an AGC gain change may not be well accounted for in the BBIC demodulation and this may affect the BBIC demodulation performance.

AGC controller solutions common in the art are based on a time-domain power measurement. For example, in some implementations time domain powers from OFDM symbols carrying cell-specific reference signals, i.e., pilots, are measured, from which a peak power estimate is selected and compared against a target power reference to determine the AGC gain for the next subframe.

In another example, time-domain powers from several OFDM symbols are measured, from which a peak power estimate is selected and compared against a target power reference to determine the AGC gain for the next subframe.

Some conventional time-domain power based AGC designs are susceptible to dynamic downlink resource allocations and will result in frequently updated AGC gains, which degrade the receiver performance. Some implementations of the present application allow generation of AGC gain adjust values that are insensitive to dynamic downlink resource allocations.

In some aspects of the present application, the basic idea is for a UE to determine an AGC gain adjustment value that is based upon measured power values of resource elements carrying at least one of reference signals and other downlink channel/signals. Within each subframe of a received signal, one or more resource element blocks can be used for determining an average resource element power value within the resource element blocks and can then be applied as a power value within the subframe for other resource element blocks that collectively form the subframe. This average value can then be used in determining the gain adjustment value.

In LTE, the aforesaid resource elements are processed in the frequency domain by transforming the received time-domain samples to frequency domain as expressed below.

$$Y(k, l) = \sum_{n=0}^{N-1} r(n, l) e^{-j2\pi kn/N} \quad (5)$$

where $\{r(n,l), n=0, 1, \ldots, N-1\}$ are the received samples within the l-th OFDM symbol duration; N is the FFT size; k is a subcarrier index; and $\{e^{-j2\pi kn/N}, n=0, 1, \ldots, N-1\}$ is an exponential sequence for subcarrier k. Y(k,l) is considered as the received signal at resource element (k,l).

The gain adjustment is determined based on the measured resource element power values of Y(k,l) from a plurality of resource element blocks, which are essentially from a plurality of subcarriers k by a plurality of symbol intervals.

For a UE, the transformation expressed in (5) for LTE is analogous to a dispreading operation in a CDMA system to convert input time-domain samples in the chip rate to modulated symbols in a code domain, where the dispreading is given by $$D(k, l) = \sum_{n=0}^{N^{(k)}-1} r(n, l) c_n^{(k)} \quad (6)$$

where $\{r(n,l), n=0, 1, \ldots, N^{(k)}-1\}$ are the received samples within the l-th symbol interval for sequence index k; $N^{(k)}$ is the spreading factor associated with index k; $\{c_n^{(k)}, n=0, 1, \ldots, N-1\}$ is a spreading sequence for sequence index k. In some embodiments, $N^{(k)}$ may vary for different sequence indices. D(k,l) can be considered as a received sample at a resource element corresponding to sequence index k and symbol duration l.

Accordingly, a gain adjustment in the CDMA system may be determined based on the powers of D(k,l) for a plurality of resource elements in order to mitigate problems that could arise due to time domain gain processing. For example, dynamic downlink spreading sequence allocations as part of dynamic downlink resource allocations in the CDMA system may change the time-domain signal power level abruptly. If a time-domain AGC gain processing module updates gains based on power estimates from recent symbol intervals, the gains may be updated frequently as the power estimates are susceptible to dynamic downlink resource allocations. The frequently updated AGC gains may degrade receiver performance. If the time-domain AGC gain processing module updates gains based on power estimates from symbol intervals over a long time duration, the gains may be updated very slowly and may not be able to reflect quickly the power change due to the channel fading, resulting in degraded receiver performance.

Returning back to the discussion of operation in LTE, for the smallest channel bandwidth (BW) configuration equal to 1.4 MHz, in one subframe the number of resource elements used for cell specific reference signals, or pilots, is, as an example, 48 resource elements for transmission by a given antenna, which is much smaller as compared with other channel bandwidth configuration. The number of pilot resource elements within one subframe for transmission by a given antenna in some implementations for channel bandwidth configurations equal to 5, 10, and 20 MHz is 200, 400, and 800, respectively. Therefore, being able to use other resource elements, which may or may not include the pilot resource elements, within the subframes for measuring power may aid in providing a better estimation of power that is used in determining a gain adjustment value, which in turn may reduce the rate of change of gain. As a result demodulation performance may be improved as compared to a case with frequent gain changes. In a particular E-UTRA implementation for a 1.4 MHz BW with one transmit antenna, the aforementioned channels/signals occupy the following numbers of resource elements. The PCFICH occupies 16 resource elements in each subframe. The PBCH occupies 240 resource elements once every 10 subframes. The PSS/SSS each occupies 62 resource elements once every 5 subframes. The PSS and SSS typically may each occupy a respective OFDM symbol, or part thereof.

Power Measurement for Full Allocation Power Level Projection

A UE can measure the powers of many types of downlink resource elements even though there may or may not be PDSCH resource elements allocated for the UE, as long as the UE is capable of receiving those types of resource elements.

It is noteworthy to mention that not all OFDM symbols transmitted by a base station may be available for power measurement and as such a UE will perform power measurements on available OFDM symbols. In some implementations, if a UE cannot find downlink scheduling information that pertains to the UE in received PDCCH symbols at the beginning of a subframe, the UE may temporarily turn off its downlink reception for the rest of the subframe and sleep until the start of a next subframe in an attempt to conserve energy. Such sleep may be referred to as micro-sleep.

However, due to PDCCH decoding latency, the micro-sleep might begin several OFDM symbol durations (200 μs to 300 μs as an example) after the last PDCCH OFDM symbol from which the UE determines whether there is any information for the UE in the subframe. As a result, resource elements available for power measurement in a subframe would be resource elements received between the start of the subframe and before the start of the micro-sleep. In the period prior to the start of the micro-sleep the resource elements in which the power could be measured may occur in one or more of, for example, the pilots, PCFICH, PDCCH, PSS/SSS, PBCH and PDSCH. If the UE does not temporarily shut down in a micro-sleep, all resource elements within one subframe may be available for power measurement.

Several examples of determining power measurements for one or more resource element blocks per subframe using different types of channel/signals will be described below.

Within a resource element block that is two or more OFDM contiguous subcarriers by one or more OFDM symbol durations or two or more OFDM symbol durations by one or more OFDM contiguous subcarriers, the power can be measured in some embodiments by measuring power of the OFDM subcarrier at each of the one or more OFDM symbol durations, i.e., by measuring the power of each resource element within the resource element block. Then the measured resource element powers can be averaged to determine a power value per resource element for the resource element block. This power value per resource element can be used to compute an average resource element power value to be projected across the full downlink frequency allocation. The computed power is compared against a target power level to determine a gain adjustment.

The resource elements that are measured in the resource element block for a downlink channel/signal of interest are resource elements that may or may not be pilot resource elements. The UE is aware of which resource elements in the frame and subframe are for the downlink channel/signal of interest and therefore the UE does not use the measurements, if they have been made, of other resource elements for the purpose of determining the average value per resource element per resource element block for the downlink channel/signal of interest.

As some methods described herein involve measuring frequency-domain resource element power, it is assumed for at least some of such implementations that subframe synchronization has been performed so that the starting locations of frames, subframes and slots are known. Before the subframe synchronization, a conventional time-domain power estimate can be used to derive gain values. Alternatively, before the subframe synchronization, a frequency domain power estimate can be also used, in which all powers from frequency domain resource elements, regardless of whether those resource elements are being occupied or not, are averaged and used as a power estimate to input to block 220 of FIG. 2 to ultimately derive gain values.

A resource element block of the plurality of resource element blocks can be selected for power measurement based on information determined about the subframe. Information determined about the subframe may include, but is not limited to, decoding information in the control channels to determine the location of other channels in the subframe and determining whether PDSCH information is detected in the subframe for the particular UE. The information determined about the subframe may enable the UE to make a more informed decision regarding which resource elements are occupied and thus likely to yield a more appropriate power value pertaining to the resource element block that is selected for power measurement.

The same process as described above can be used to determine a power value per resource element for a resource element block for each of multiple resource element blocks within a subframe, that is, resource element blocks that are immediately adjacent or spaced apart, in a periodic or random spacing. An average resource element power value can then be determined for multiple resource element blocks based on the power value per resource element determined for each of those multiple resource element blocks. The average resource element value based on the multiple resource element blocks can then be used to compute an average resource element power that is representative of occupied resource elements for the subframe across the full downlink frequency allocation. In some embodiments, by using multiple measurements from resource element blocks across the subframe, a better overall resource element power average may be generated for the subframe.

In some embodiments, multiple resource element blocks of the same channel type, that is resource element blocks that are of the same size, are used for determining the average resource element value. For example, multiple PDSCH resource blocks or multiple PBCH resource element blocks or multiple PDCCH resource element blocks could be used in determining an average resource element value for the subframe.

As illustrated in FIG. 3, not all subframes have each of all of the various types of channels/signals. Therefore, depending on what portion of the subframe is being used to measure the resource element power, i.e. which channel/signal is selected for power measurement, different size resource element blocks may be measured when generating an average power for the subframe. For example, in the first subframe of FIG. 3 an average resource element power of a resource element block used for the pilots, an average resource element power of a resource element block used for the PBCH, an average resource element power of a resource element block used for the PSS/SSS and an average resource element power of a resource element block used for one or more PDSCH could all be averaged together to determine an average resource element power that would be representative of occupied resource elements across the full downlink frequency allocation. In other examples, the first subframe may use the average resource element power from only one or more PDSCH to determine an average resource element power that would then representative of occupied resource elements across the full downlink frequency allocation, or only the average resource element power from a resource element block used for pilots to determine an average resource element power that would then be representative of occupied resource elements across the full downlink frequency allocation, or only the average resource element power from a resource element block used for PBCH to determine an average resource element power that would then be representative of occupied resource elements across the full downlink frequency allocation, or only the average resource element power from a resource element block used for PCFICH to determine an average resource element power that would then be representative of occupied resource elements across the full downlink frequency allocation.

If the resource element blocks for which the resource element power is determined are of different sizes, i.e. number of OFDM subcarriers by number of OFDM symbol durations, than a normalization or scaling factor could be used to ensure a consistent average power per resource element block is being determined for use in the average resource element power computation that is representative of occupied resource elements over the full downlink frequency allocation.

Some resource element blocks are known to always be occupied. For example resource element blocks that individually or collectively form pilots, PBCH, PCFICH, PSS and SSS, are considered to always be occupied based on the fact that their content is information pertaining to the received signal, such as how large other channels are or synchronization information that is always transmitted in the signal. As these resource element blocks are always occupied, the UE can use these resource element blocks and obtain a reliable average value and use that to project a power level for a fully occupied downlink frequency allocation.

PDSCH resources, as discussed above, may or may not be occupied, depending if there is information to be transmitted to UEs that the base station communicates with. Therefore, to reliably use a resource element block allocated for PDSCH a UE must be confident that the resource element block is occupied within the subframe. If a UE can determine if it is to receive PDSCH information in the subframe, then the UE can use the PDSCH information in one or more resource element blocks allocated to the UE for average power projection with a reasonably high degree of confidence. If the UE cannot determine if there is PDSCH information for the UE, then it may need alternative means to determine if the resource element block for which power is being measuring is occupied or not, such as comparing the determined average resource element power values of the resource element block to a threshold value that would define a fully occupied resource block. The threshold value could, for example, be a portion of the averaged pilot power.

In order to determine if there is PDSCH information for the UE, the UE in a subframe can attempt to decode the downlink PCFICH channel to determine a number of OFDM symbol durations carrying PDCCH information in the current subframe. The UE needs to do this anyway. If a UE can decode a PDCCH with cyclic redundancy check (CRC) pass, the UE can determine that there is PDCCH information for the UE and can make use of the resource elements carrying that PDCCH information to do a power average. If the UE can decode the PDCCH then the UE can determine if there are PDSCH allocated for the UE. Once the UE is able to determine that there is PDSCH information for the UE and the location where that information is, the UE can use that location information to measure power values in one or more resource element blocks that the UE knows are occupied.

If the UE is unable to determine that there is PDSCH information for the UE, i.e. for resource element blocks that are not known to be occupied, the UE can compare measured power values for resource elements to a threshold that would determine whether the resource element block is occupied or not. This comparison could be made on the basis of powers measured per resource element per PDSCH OFDM symbol duration, average power per resource element, or average power per resource element block. For each PDSCH resource element block, the resource element block is considered to be occupied if the averaged resource element power on that resource element block exceeds a threshold.

An example of how frequency domain power averaging can be performed when applied to determining the power for a resource element block in the PDSCH in which the PDSCH is not for the UE will be described below.

In a resource element block for which the frequency domain power averaging is to be performed, an average resource element power, for the resource element block is determined from the OFDM symbol durations in each OFDM subcarrier, which is denoted as $P_{PDSCH}(m)$ for resource element block m, by determining the power for each OFDM symbol duration l in OFDM subcarrier k and then averaging the determined power over $N_{PDSCH,RE}(m)$ resource elements designated for PDSCH transmission within the resource element block. The resource element block contains 12 contiguous subcarriers over the available OFDM symbol durations within one subframe. Therefore $P_{PDSCH}(m)$ is an average of the resource element power in the resource element block for the PDSCH OFDM symbol durations, which can be expressed as equation (7) below:

$$P_{PDSCH}(m) = \frac{1}{N_{PDSCH,RE}(m)} \sum_k \sum_l P_{PDSCH,RE}(k, l) \qquad (7)$$

where $N_{PDSCH,RE}(m)$ is the total number of resource elements designated for PDSCH transmission within the resource element block, $P_{PDSCH,RE}(k,l)$ is the resource element power measured at subcarrier k for OFDM symbol duration l, i.e. the (k,l)-th resource element of resource element block m. Here, resource elements being designed for PDSCH transmission mean those resource elements can be used for PDSCH transmission to one or more UEs in the cell, which may or may not be occupied in the current subframe.

In some embodiments, the UE determines how many OFDM symbol durations are available for power measurement before the power measurement process begins. This may be relevant in some embodiments, for example if the UE is going to micro-sleep for a portion of the subframe if there is no detected PDSCH information for the UE.

In the particular described example, as the UE is unaware as to whether a resource element block is occupied or not, the UE attempts to determine whether the resource element block is occupied by determining a resource element block occupation indicator $S_{PDSCH}(m)$ for the resource elements in the resource element block based on the following equation:

$$S_{PDSCH}(m) = \begin{cases} 1 & \text{if } P_{PDSCH}(m) > T_{Active,PDSCH} \\ 0 & \text{Otherwise} \end{cases} \qquad (8)$$

The resource element block occupation indicator for the resource element block $S_{PDSCH}(m)$ is set to 1 if the average resource element power $P_{PDSCH}(m)$ for all resource elements within the resource element block being measured is determined to be larger than $T_{Active,PDSCH}$ or 0 otherwise. $T_{Active,PDSCH}$ is a threshold, which may be set to a value that is proportional to a cell specific reference signal resource element power $\overline{P}_{RS}$. The average RS resource element power $\overline{P}_{RS}$ for one or more resource element blocks is determined by summing the RS powers from the one or more resource element blocks carrying the reference signals and dividing the sum by the total number of RS resource elements carrying the reference signals within the one or more resource element blocks.

Determining the average power per resource element of all occupied PDSCH resource element blocks can be represented as:

$$\overline{P}_{PDSCH,Active} = \begin{cases} \dfrac{\sum_m S_{PDSCH}(m) \cdot P_{PDSCH}(m)}{N_{PDSCH,RB,Active}}, & \text{if } N_{PDSCH,RB,Active} > 0 \\ \overline{P}_{RS} & \text{otherwise} \end{cases} \quad (9)$$

where $N_{PDSCH,RB,Active}$ is the number of resource element blocks declared occupied by PDSCH, i.e., being PDSCH active. If $N_{PDSCH,RB,Active} > 0$, $\overline{P}_{PDSCH,Active}$ is set to the mean of $P_{PDSCH}(m)$ of the occupied PDSCH resource element blocks. Otherwise, $\overline{P}_{PDSCH,Active}$ is set to the average reference signal (RS) power $\overline{P}_{RS}$.

More generally, equation (9) above applies to calculating the average power per resource element of occupied resource element blocks of any channel type, such as, but not limited to PBCH, PCFICH and PDCCH, PSS and SSS.

Full Allocation Power Level Projection

Estimating an average power per resource element for the subframe as if all resource elements within the subframe were occupied can be expressed as follows:

$$P_{PDSCH,sf} = \overline{P}_{PDSCH,Active} \dfrac{N_{PDSCH,RE}^{(DL)}}{N_{PDSCH,RE}^{(DL)} + N_{RS,RE}^{(DL)}} + \overline{P}_{RS} \dfrac{N_{RS,RE}^{(DL)}}{N_{PDSCH,RE}^{(DL)} + N_{RS,RE}^{(DL)}} \quad (10)$$

where $N_{PDSCH,RE}^{(DL)}$ is the total number of resource elements from one or more resource element blocks designated for PDSCH transmission within one subframe and $N_{RS,RE}^{(DL)}$ is the total number of RS resource elements from the one or more resource element blocks designated to carry RS within one subframe. Note that $$\dfrac{N_{PDSCH,RE}^{(DL)}}{N_{PDSCH,RE}^{(DL)} + N_{RS,RE}^{(DL)}} \text{ and } \dfrac{N_{RS,RE}^{(DL)}}{N_{PDSCH,RE}^{(DL)} + N_{RS,RE}^{(DL)}}$$

are two scaling factors for two power values $\overline{P}_{PDSCH,Active}$ and $\overline{P}_{RS}$, respectively, to proportionally scale, based on the numbers of resource elements corresponding to the two power values, the contribution of the two power values to the final power average.

The above description pertains particularly to determining a subframe average power per resource element when using PDSCH and pilots, i.e. defined as $P_{PDSCH,sf}$ where n is the subframe index. More generally, as indicated above, the subframe average power per resource element may be derived from measurements from one or more resource element blocks from different channel/signal types. When the subframe average power per resource element is derived from measurements from two or more resource element blocks the measurements may be derived from resource element blocks of a single channel/signal type or multiple channel/signal types which are averaged together as to be elaborated, in which case the average power per resource element from a full allocation may be denoted as $P_{DLSubframe}(n)$.

In a more generalized approach to that described above for dealing with the PDCSH in equations (7), (9) and (10) above, the following equations can be extrapolated for dealing with a resource element block for a given channel/signal type. As such, $P_{chREB}(m)$ an average of the resource element power in the resource element block for the OFDM symbol durations, which can be expressed as equation (11) below:

$$P_{chREB}(m) = \dfrac{1}{N_{chREB,RE}(m)} \sum_k \sum_l P_{chREB,RE}(k,l) \quad (11)$$

where $N_{chREB,RE}(m)$ is the total number of resource elements designated for transmission within the resource element block of the given channel/signal type, $P_{chREB,RE}(k,l)$ is the resource element power measured at subcarrier k for OFDM symbol duration l, i.e. the (k,l)-th resource element of resource element block m of the given channel type. $P_{chREB}(m)$ is set to 0 if $N_{chREB,RE}(m)=0$, meaning there is no resource element designated for the transmission of the given channel/signal type in the resource element block for which the average power is computed. Determining the average power per resource element of all occupied resource element blocks can be represented as follows for a more general case of a resource element block:

$$\overline{P}_{chREB,Active} = \begin{cases} \dfrac{\sum_m S_{chREB}(m) \cdot P_{chREB}(m)}{N_{chREB,Active}}, & \text{if } N_{chREB,Active} > 0 \\ \overline{P}_{RS} & \text{otherwise} \end{cases} \quad (12)$$

where $N_{chREB,Active}$ is the number of resource element blocks declared occupied and $S_{chREB}(m)$ is the resource element block occupation indicator for the resource element block. If $N_{chREB,Active} > 0$, $\overline{P}_{chREB,Active}$ is set to the mean of $P_{chREB}(m)$ of the occupied resource element blocks. Otherwise, $\overline{P}_{chREB,Active}$ is set to the average reference signal power $\overline{P}_{RS}$.

Estimating the power per resource element as if all resource element blocks, including pilots, were occupied can be expressed as calculating the power per resource element within each OFDM symbol duration of the subframe followed by finding the peak from the calculated powers, i.e., $$P_{DLSym}(l) = \sum_{chREB \in \Omega(l)} \dfrac{N_{chREB,RE}^{(DL)}(l)}{N_{total,RE}^{(DL)}(l)} \overline{P}_{chREB,Active}, \quad (13)$$

$$l = 0, 1, \ldots, N_{sym} - 1$$

$$P_{DLSubframe} = \max\{P_{DLSym}(l), l = 0, 1, \ldots, N_{sym} - 1\}$$

where $P_{DLSym}(l)$ is the power per resource element within OFDM symbol duration l as if all resource elements within that symbol duration were occupied, $N_{chREB,RE}^{(DL)}(l)$ is the total number of resource elements for OFDM symbol duration l within one or more resource element blocks of one subframe designed for transmission of the given channel/signal type. $\Omega(l)$ is a set of channel/signal types being considered in the power average within the OFDM symbol duration l. $N_{total,RE}^{(DL)}(l) = \Sigma_{chREB \in \Omega} N_{chREB,RE}^{(DL)}(l)$ is a total number of resource elements for OFDM symbol duration l within one or more resource element blocks of all channel/signal types in the set $\Omega(l)$. $N_{sym}$ is the number of OFDM symbol durations available within one subframe for the power measurement. $N_{sym}$ is the total number of OFDM symbols within one subframe if the UE does not go to micro-sleep. Otherwise, $N_{sym}$ is the total number of OFDM symbols received by the UE goes to micro-sleep.

$$\frac{N_{chREB,RE}^{(DL)}(l)}{N_{total,RE}^{(DL)}(l)}$$

is a scaling factor to scale the contribution of the average resource element power value from each channel/signal type in the set Ω(l). The channel/signal type could be, but is not limited to, at least one of pilots, PDSCH, PBCH, PCFICH and PDCCH, PSS and SSS.

Alternatively, estimating the power per resource element as if all resource element blocks, including pilots, were occupied can be expressed as an average power per resource element within one subframe as follows:

$$P_{DLSubframe} = \sum_{chREB \in \Omega} \overline{P}_{chREB,Active} \frac{N_{chREB,RE}^{(DL)}}{N_{total,RE}^{(DL)}} \quad (14)$$

where $N_{chREB,RE}^{(DL)}$ is the total number of resource elements within one or more resource element blocks of one subframe designed for transmission of the given channel/signal type. $N_{chREB,RE}^{(DL)}$ can be understood as the summation of $N_{chREB,RE}^{(DL)}(l)$ over $N_{sym}$ OFDM symbol durations. Ω is a set of channel/signal types being considered in the power average for the subframe. $N_{total,RE}^{(DL)} = \Sigma_{chREB \in \Omega} N_{chREB,RE}^{(DL)}$ is a total number of resource elements within one or more resource element blocks of all channel/signal types in the set $$\Omega. \quad \frac{N_{chREB,RE}^{(DL)}}{N_{total,RE}^{(DL)}}$$

is a scaling factor to scale the contribution of the average resource element power value from each channel/signal type in the set Ω. The channel/signal type could be, but is not limited to, at least one of pilots, PDSCH, PBCH, PCFICH and PDCCH, PSS and SSS.

IIR Filtering on Full Allocation Power Level Projection

IIR filtering can be employed to filter $P_{DLSubframe}(n)$, i.e., $$\overline{P}_{DLSubframe}(n) = \alpha \cdot \overline{P}_{DLSubframe}(n-1) + (1-\alpha) \cdot P_{DLSubframe}(n) \quad (15)$$

where α is a forgetting factor and n is a subframe index.

Gain Adjustment Determination

In some embodiments, the gain adjustment is based on $\overline{P}_{DLSubframe}(n)$ and a target power level. If $\overline{P}_{DLSubframe}(n)$ is less than the target power level, the gain should be increased. Otherwise, the gain should be decreased. As an example, the gain adjustment for n+1, i.e., Δg(n+1), can be given by, $$\Delta g(n+1)dB = \mu \cdot [P_{target}dB - \overline{P}_{DLSubframe}(n)dB] \quad (16)$$

where $P_{target}$ is the target power level defined as a target average power per resource element as if all resource elements were occupied and $\mu \in (0,1]$ is a step-size.

It is possible that downlink channels within frame or subframe use different transmission power levels. The difference between the power levels of downlink channels in most cases is not large, has been partially taken care of in the power averaging for each channel in equation (13) or equation (14), and can be further taken care of by adding a safety margin in the target power level used in the gain adjustment determination when certain channel types are being used for power measurement. For the latter, the target power level is given by $$P_{target}dB = P_{target,nominal}dB - \beta(dB) \quad (17)$$

where $P_{target,nominal}$ is a nominal target power level and β is a safety margin.

In some implementations, the safety margin may be set to 3 dB during the day when network is likely busy or 0 dB at night when network is likely idle.

Target Power Level Adjustment

In some embodiments, the target power level may be further adjusted depending on the channel condition. A UE can estimate a Doppler frequency estimate and then use the estimated Doppler frequency to determine whether the UE is likely in an AWGN channel (Doppler frequency<a Doppler frequency threshold) or in a fading channel (Doppler frequency>the Doppler frequency threshold).

Figure 4:
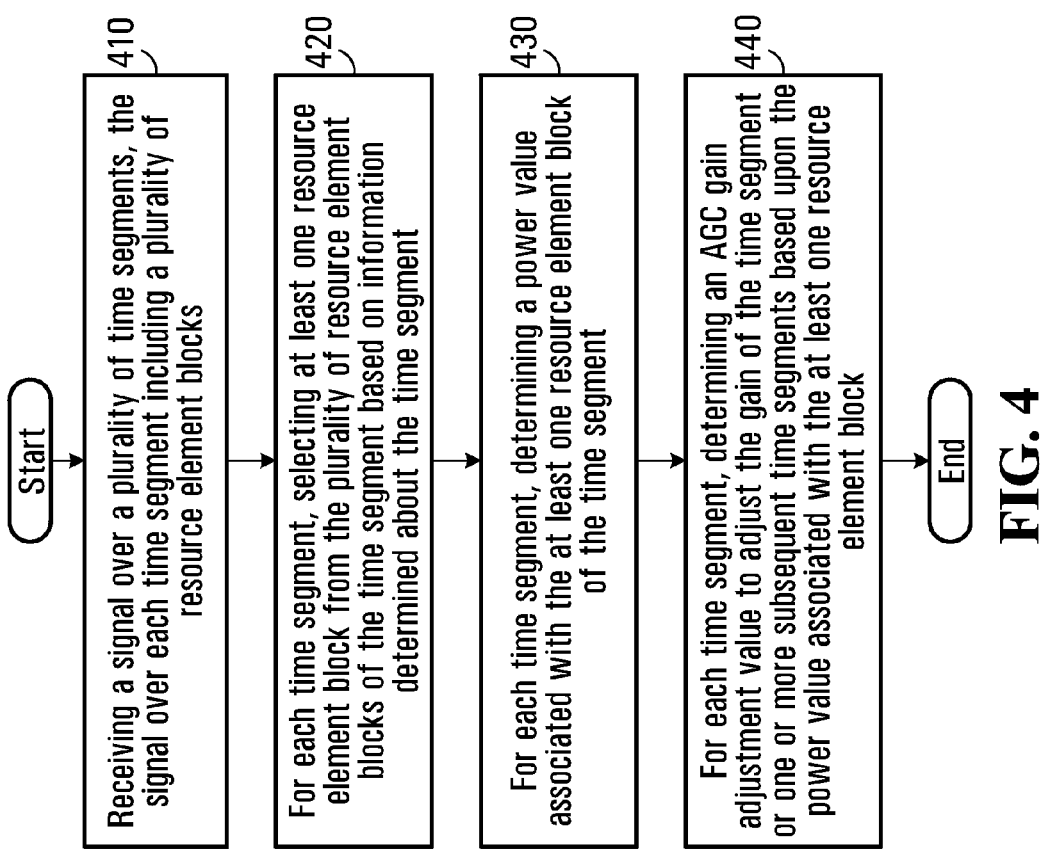
FIG. 4 is a flow chart illustrating a method of determining gain according to an embodiment of the application.

With reference to FIG. 4 a method will now be described for use in a receiver. A first step 410 involves receiving a signal over a plurality of time segments, the signal over each time segment including a plurality of resource element blocks. A second step 420 involves for each time segment, selecting at least one resource element block from the plurality of resource element blocks of the time segment based on information determined about the time segment. A third step 430 involves for each time segment, determining a power value associated with the at least a resource element block of the time segment. A fourth step 440 involves for each time segment, determining a gain adjustment value to adjust the gain of the time segment or one or more subsequent time segments based upon the power value associated with the at least one resource element block.

In some embodiments, prior to step 420 the method may involve converting the signal from time domain into another domain, such as frequency domain or code domain.

Figure 5:
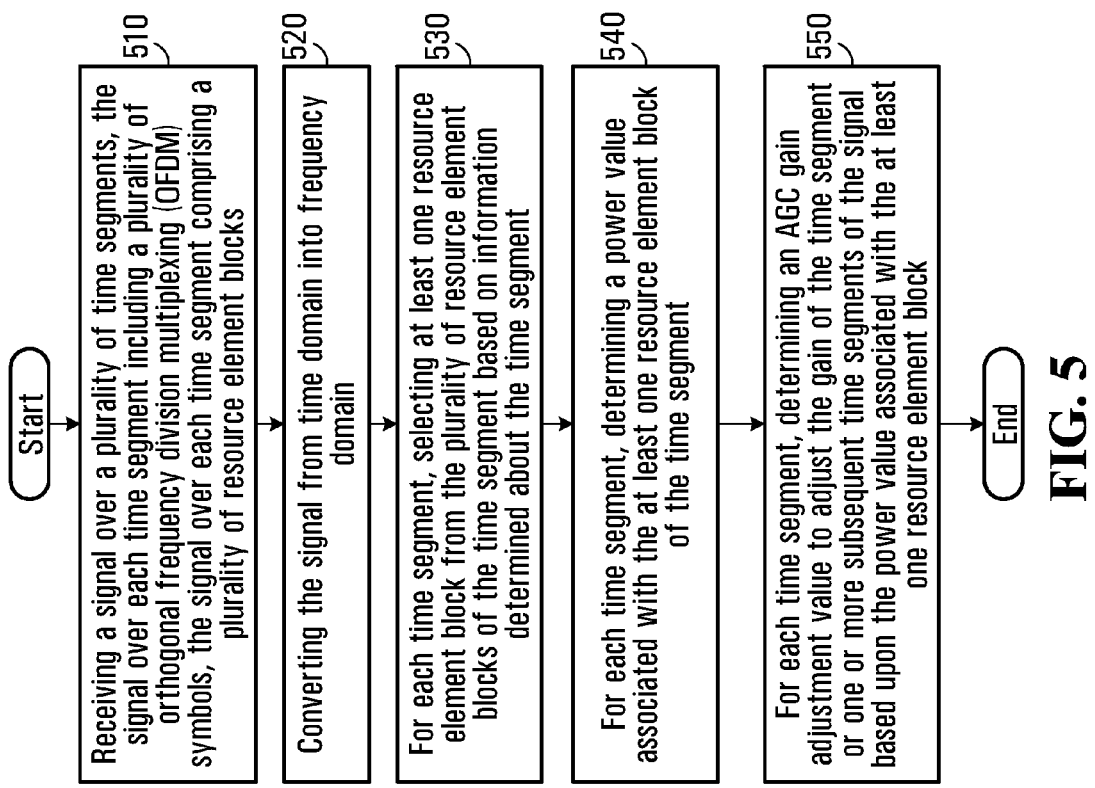
FIG. 5 is a flow chart illustrating another method of determining gain according to an embodiment of the application for an OFDM system.

With reference to FIG. 5 a particular example method directed to LTE will be described for use in a receiver utilizing gain control. A first step 510 involves receiving a signal over a plurality of time segments, the signal over each time segment including a plurality of orthogonal frequency division multiplexing (OFDM) symbols, the signal over each time segment including a plurality of resource element blocks. Each resource element block includes a plurality of resource elements and each resource element comprising an OFDM symbol duration on an OFDM subcarrier. A second step 520 involves, converting the signal from time domain into frequency domain. A third step 530 involves for each time segment, selecting at least one resource element block from the plurality of resource element blocks of the time segment based on information determined about the time segment. A fourth step 540 involves for each time segment, determining a power value associated with the at least a resource element block of the time segment. A fifth step 550 involves for each time segment, determining a gain adjustment value to adjust the gain of the time segment or one or more subsequent time segments based upon the power value associated with the at least one resource element block.

Figure 6:
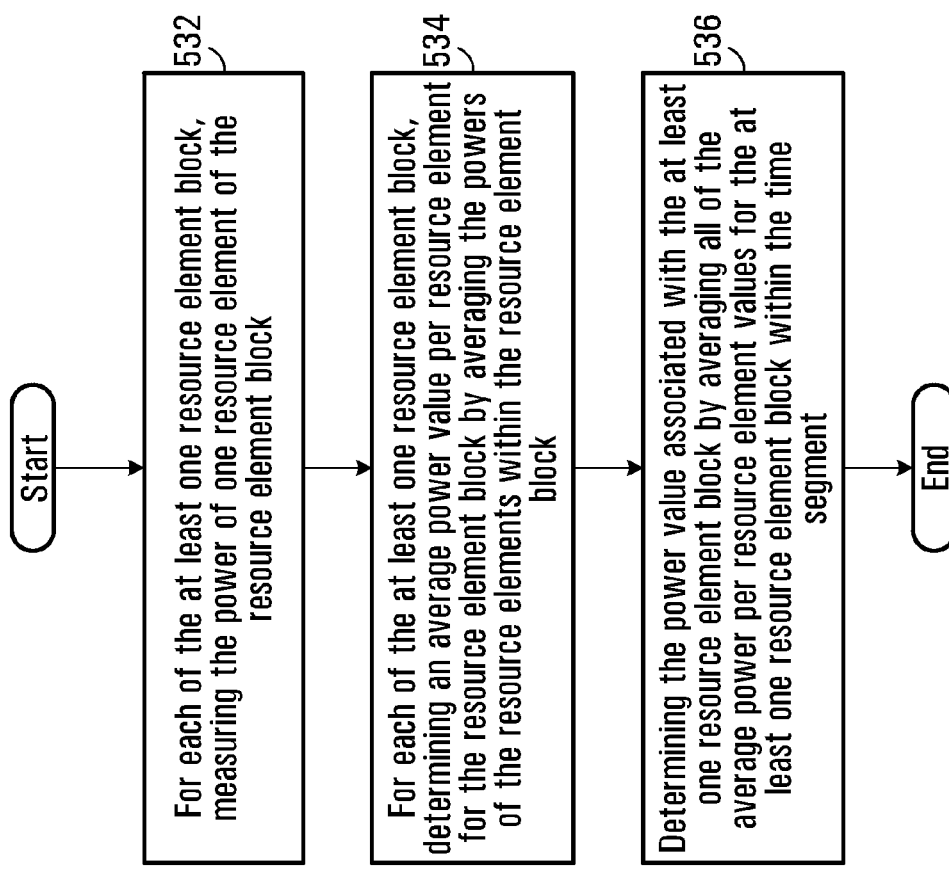
FIG. 6 is a flow chart illustrating a method of estimating an average power value for a resource element block according to an embodiment of the application.

With reference to FIG. 6, a more detailed method will now be described for estimating a power value for the time segment. A first step 532 involves for each of the at least one resource element block, measuring the power of each resource element of the respective resource element block. A second step 534 involves for each of the at least one resource element block, determining an average power value per resource element for the respective resource element block by averaging the powers of the resource elements within the resource element block. A third step 536 involves determining the power value associated with the at least one resource element block by averaging all of the average power per resource element values for the at least one resource element block within the time segment.

Determining the first power value associated with the at least one resource element block may further include the step of determining if each of the at least one resource element blocks is an occupied resource element block by comparing the average power value per resource element for the resource element block to a threshold that defines an occupied resource element block. If the average power value per resource element for a resource element block is less than the threshold, then the resource element block is not included in the average when determining the first power value.

The at least one resource element block is a portion of one of: one or more pilots, a physical downlink control channel (PDCCH); a physical downlink shared channel (PDSCH); a physical control format indicator channel (PCFICH); a primary synchronization signal (PSS); a secondary synchronization signal (SSS); and a physical broadcast channel (PBCH).

When the resource element block is in particular the PDSCH, the method of FIG. 5 may include further steps described below with reference to FIG. 7. The steps of FIG. 7 may be performed as part of, for example, estimating step 540 of FIG. 5. A first step 610 includes for each time segment, decoding PCFICH information to determine how many OFDM symbols are carrying PDCCH information. Determining how many OFDM symbols are carrying PDCCH information may enable the UE to determine where PDSCH information is located in the received signal, thereby enabling PDSCH resource element blocks to be located in the time segment. A second step 620 includes, for each time segment, determining where physical downlink shared channels (PDSCH) are located in the time segment. A third step 630 includes, for each time segment, determining if there is any PDSCH information for the receiver in the time segment. If there is PDSCH information for the receiver (Y path from 630), a further step 640 involves determining the location of the PDSCH information in the time segment. If there is no PDSCH information for the receiver and the receiver is configured to temporarily shut down if no PDSCH information is detected, (N path from 630), a further step 650 involves determining how many OFDM symbol durations in the resource element block are available for power measurement before the receiver temporarily shuts down for at least a remainder of the time segment.

Figure 7:
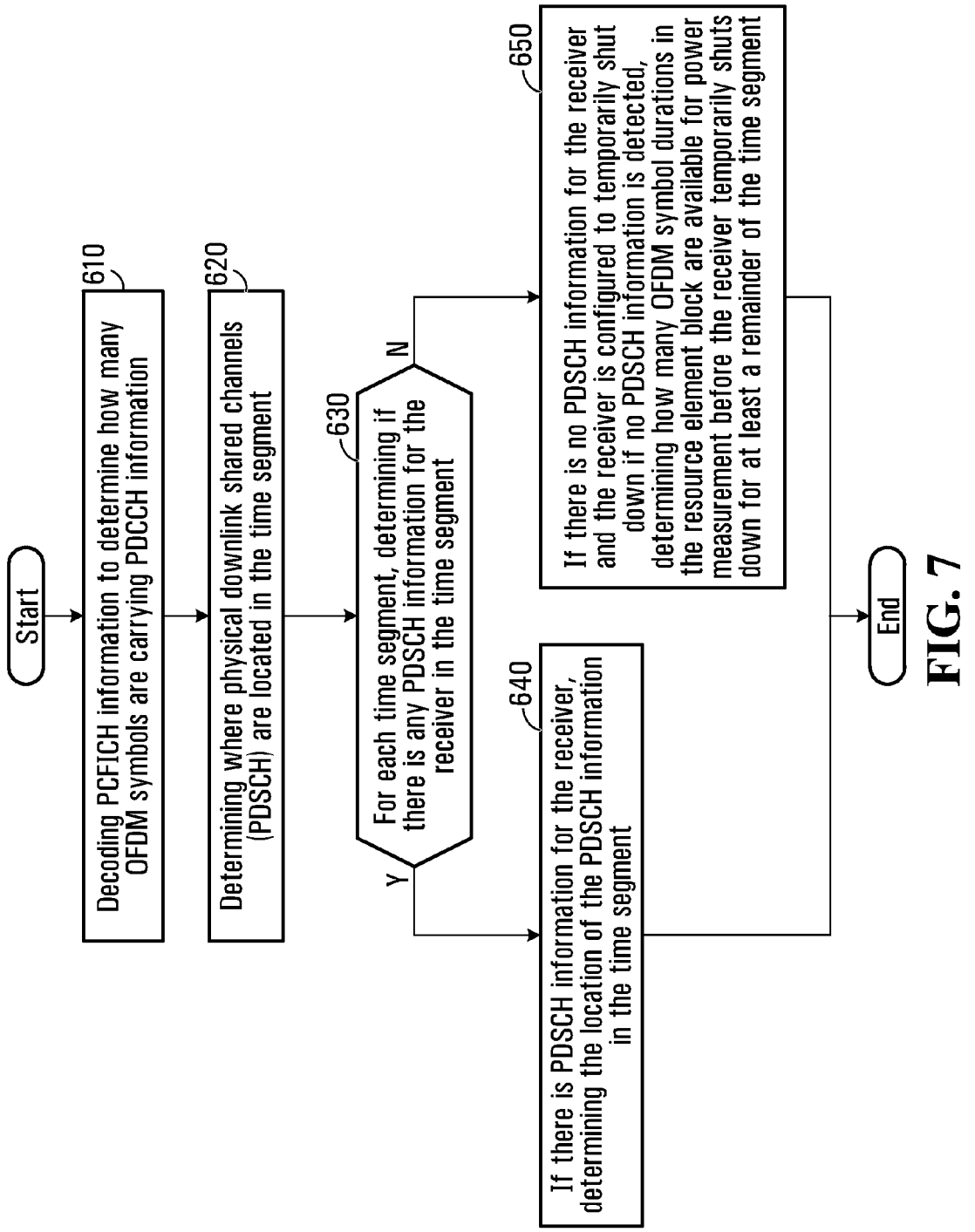
FIG. 7 is a flow chart illustrating a method of determining the physical downlink shared channel (PDSCH) resource elements used for power estimation according to an embodiment of the application.

Not all of the steps of FIG. 7 may be included in all embodiments. For example it may be that only step 610 is performed if it is determined that the UE only wants to use PCFICH, PDCCH channels, and the pilots in the first OFDM symbol of the subframe. Furthermore, by way of example it may be possible to determine, based on the largest possible number of OFDM symbols that could be used to carry PDCCH, where the PDSCH channels are located without steps 610 and 620 and only steps 630 and 640 or 650 are performed.

Figure 8:
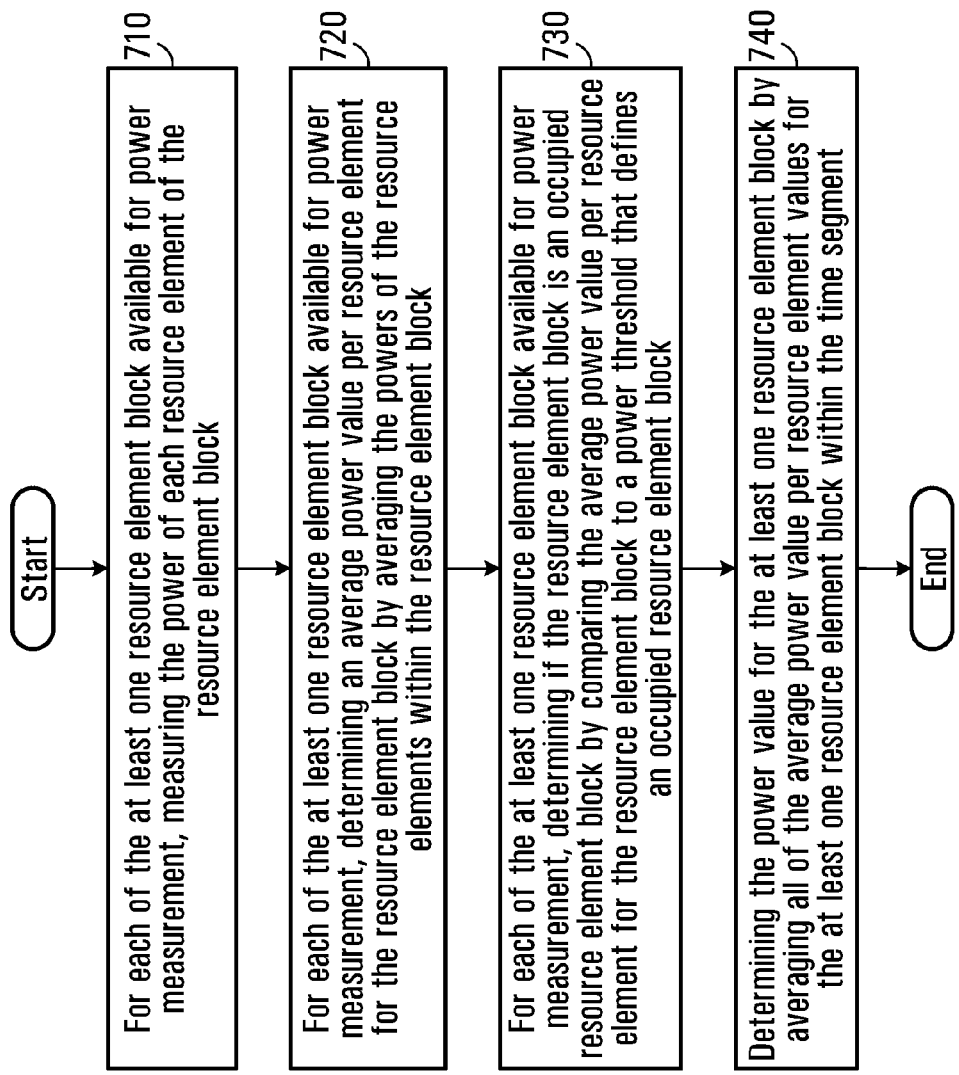
FIG. 8 is a flow chart illustrating a method of determining a power value for one PDSCH resource element block according to an embodiment of the application.

In some embodiments, if there is no PDSCH information for the receiver and if at least one resource element block for which the power is to be estimated is the PDSCH, a further method may involve comparing a measured power per resource element for each of the at least one resource element block to a threshold to determine if the resource element blocks are occupied, which will be explained in further detail with reference to FIG. 8. A first step 710 involves for each of the at least one resource element block available for power measurement, measuring the power of the each resource element of the respective resource element block. A further step 720 involves for each of the at least one resource element block available for power measurement, determining an average power value per resource element for the respective resource element block by averaging the powers of the resource elements within the respective resource element blocks. A further step 730 involves for each resource element block available for power measurement, determining if the resource element block is an occupied resource element block by comparing the average power value per resource element for the respective resource element block to a power threshold that defines an occupied resource element block. A further step 740 involves determining the power value for the at least one resource element block by averaging all of the average power value per resource element values for the at least one resource element block within the time segment.

In some embodiments, the methods described above may also include, for each time segment, determining how many OFDM symbol durations in at least one resource element block are available for power measurement. For example if no PDSCH information is found for the UE, the UE may wish to know how many OFDM symbols are available for power measurement before the micro-sleep occurs. For some embodiments, the resource element block in the PDSCH is 12 subcarriers by a number of OFDM symbols determined to be available for power measurement. Other channel/signals have may have different resource element blocks and the size of the resource element block for a given channel/signal is implementation specific.

In some embodiments, the power estimate and thus gain update can be performed as desired. For example, the update can be performed once every "T" time segments, where T is an integer, or performed in time segments where the total number of resource elements from at least one channel/signal type available in power average is larger than a threshold and/or the time duration over which the gain has not been updated is larger than a time-duration threshold.

In some embodiments time segments in the description of the methods above correspond to subframes of an LTE signal.
BBIC Measuring a Time-Domain Power In some implementations, a time-domain power based autonomous gain controller in the RFIC is used and the BBIC can send AGC power headroom information to the RFIC. The gain adjustment in RFIC may be expressed as:

$$\Delta g(n+1)dB = \mu \cdot [P_{headroom}dB - \overline{P}_{TD,RFIC}(n)dB] \quad (18)$$

where $P_{headroom}$ is considered as a target power level. $\overline{P}_{TD,RFIC}(n)$ is a time-domain power measurement performed at RFIC.

In such a case, the BBIC may need to estimate the time-domain power in the same way that the RFIC does and compute the power headroom based on equation (19) below:

$$P_{headroom}dB = P_{target}dB - [\overline{P}_{DL,full}(n)dB - \overline{P}_{TD,BBIC}(n)dB] \quad (19)$$

where $\overline{P}_{DL,full}(n)$ is an average resource element power for the subframe as if the resource elements within the subframe are fully occupied; $\overline{P}_{TD,BBIC}(n)$ is a time-domain power measurement performed at the BBIC.

Consequently, the gain adjustment in the RFIC becomes:

$$\Delta g(n+1)dB = \mu \cdot [P_{target}dB - \overline{P}_{DL,full}(n)dB + (\overline{P}_{TD,BBIC}(n)dB - \overline{P}_{TD,RFIC}(n)dB)] \quad (20)$$

If $\overline{P}_{TD,BBIC}(n)$ is close to $\overline{P}_{TD,RFIC}(n)$, the gain adjustment can be performed as $\Delta g(n+1)dB = \mu \cdot [P_{target}dB - \overline{P}_{DL,full}(n)dB]$, which is the same as previously described in equation (16).

The above may not be a particularly efficient implementation approach for the UE as it assumes that the BBIC will repeat the time-domain power measurement performed by the RFIC.

RFIC Passing the Time-Domain Power to BBIC

To avoid repeating a time-domain power measurement at the BBIC, one solution is to have the RFIC (if supported) pass $\overline{P}_{TD,RFIC}(n)$ to the BBIC so that the BBIC can use it as $\overline{P}_{TD,BBIC}(n)$ or use it as $\overline{P}_{TD,BBIC}(n+1)$. The BBIC can configure the forgetting factor such that the variation in the time-domain power measurement from subframe n to subframe n+1 is small.

Adaptive Power Headroom Adjustment

Another solution to avoid repeating a time-domain power measurement at the BBIC and avoid having the RFIC send a time-domain measurement to the BBIC is to have the BBIC configure the RFIC to measure the time-domain power over a long time period. In that way, the time-domain power measured at the RFIC will be insensitive to the power change caused by downlink power allocations and multipath fading.

BBIC may perform the freq-domain pilot power measurement followed by an average resource element power with a full allocation power projection as described above in equation (13) or (14).

In some implementations, the power headroom adjustment is done according to equation (21) below:

$$\Delta P_{headroom}\text{dB} = v[P_{target}\text{dB} - \overline{P}_{DL,full}(n)\text{dB}] \qquad (21)$$

where $v \in (0,1]$ is a step-size; $\overline{P}_{DL,full}(n)$ average resource element power with a full allocation power projection as previously described in equation (13).

Basically, the power headroom is adjusted slightly based on the difference between the target power level and the average power per resource element for a subframe with full allocation.

Note that the average power per resource element $\overline{P}_{DL,full}(n)$ will take care of any abrupt power change due to downlink allocations. Because the time-domain power measurement in RFIC, i.e., $\overline{PP}_{TD,RFIC}(n)$, is averaged over a long time period, $\overline{P}_{TD,RFIC}(n)$ may vary slowly with downlink resource allocations and multipath fading. That slow variation will be reflected in the average power level $\overline{P}_{DL,full}(n)$ and later be counteracted by the power headroom adjustment. Of course, the step-size v should be properly selected such that the power headroom adjustment is done faster than the time-domain power measurement change.

Figure 9:
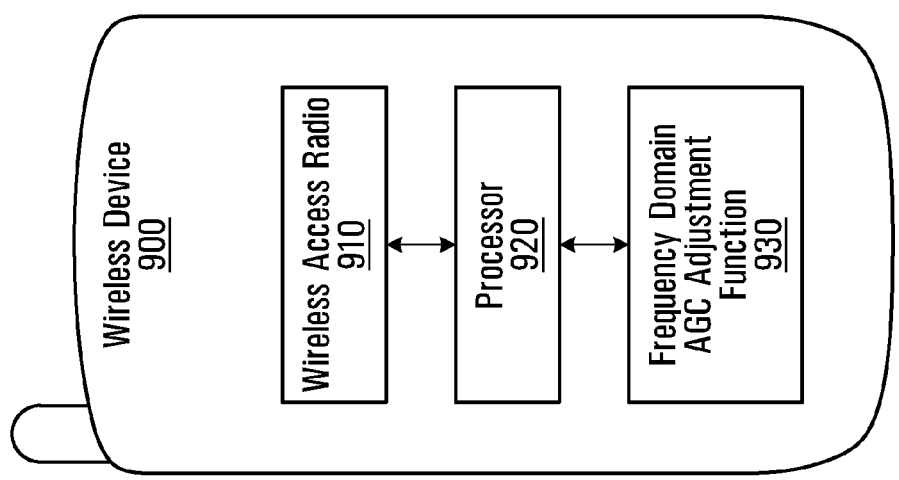
FIG. 9 is a block diagram of an example mobile device according to an implementation described herein.

Referring now to FIG. 9, shown is a block diagram of an example wireless device 900 on which embodiments described herein may operate. The wireless device 900 has a processor 920 coupled to a wireless access radio 910. The wireless access radio 910 is broadly considered to be configured to communicate with wireless networks. In some embodiments, the wireless access radio 910 may be implemented as more than one wireless access radio, each one configured to access a different type of network. The wireless device 900 also has a Gain Adjustment Function 930 that is configured to operate in a manner consistent with the methods described above to calculate a gain adjustment value based on measured power values of one or more resource element blocks in subframes of a received signal that has been converted to the frequency domain from the time domain. Gain Adjustment Function 930, while illustrated as a single functional block in FIG. 9, may also be considered to have multiple sub-components, each sub-component configured to perform in a manner consistent with a portion of one or more of the example methods described above in FIGS. 4 to 8. In some embodiments the wireless device 900 is a multi-mode wireless device.

In operation, the wireless device 900 is adapted to communicate wirelessly over one or more types of wireless communication networks, for example a Universal Telecommunications Radio Access Network (UTRAN) network or a E-UTRAN network and a Generic Access Network (GAN), such as a Wi-Fi network, using the wireless access radio 910. The wireless device 900 is adapted to communicate using circuit switched and packet switched communications separately or simultaneously. In some embodiments, wireless access radio 910 is configured to receive information broadcast by a network comprising characteristics pertaining to one or more telecommunication cells in the network. In some embodiments, the processor 920 is configured to execute the Gain Adjustment Function 930. The Gain Adjustment Function 930 is configured to perform the various methods described above.

The Gain Adjustment Function 930 can be implemented using one of software, hardware, and firmware, or a suitable combination thereof. For example, application specific integrated circuits (ASIC) or field programmable gate arrays (FPGA) may be used to implement the function in hardware. To implement the function in software, in some embodiments, a microprocessor may be used capable of executing computer readable program code instructions.

The device of FIG. 9 shows only the wireless access radio 910, the processor 920 and the Gain Adjustment Function 930 relevant to performing the determination of a gain adjustment value. It is to be understood that practical implementations would include additional physical elements or functionality, or both, to that shown, for example, elements such as those illustrated in FIG. 3, as well as other receive signal and signal processing circuitry. The preceding list is not considered to be exhaustive, but to act as an example of such additional physical elements or functionality.

In some embodiments, a gain control controller is implemented in hardware or software, or both, which is configured the implement the methods described above in FIG. 4 to FIG. 8. Such a gain controller may be an automatic gain control (AGC) controller of a type that would be used in a front end receiver block as shown in FIG. 1.

Another Wireless Device

Figure 10:
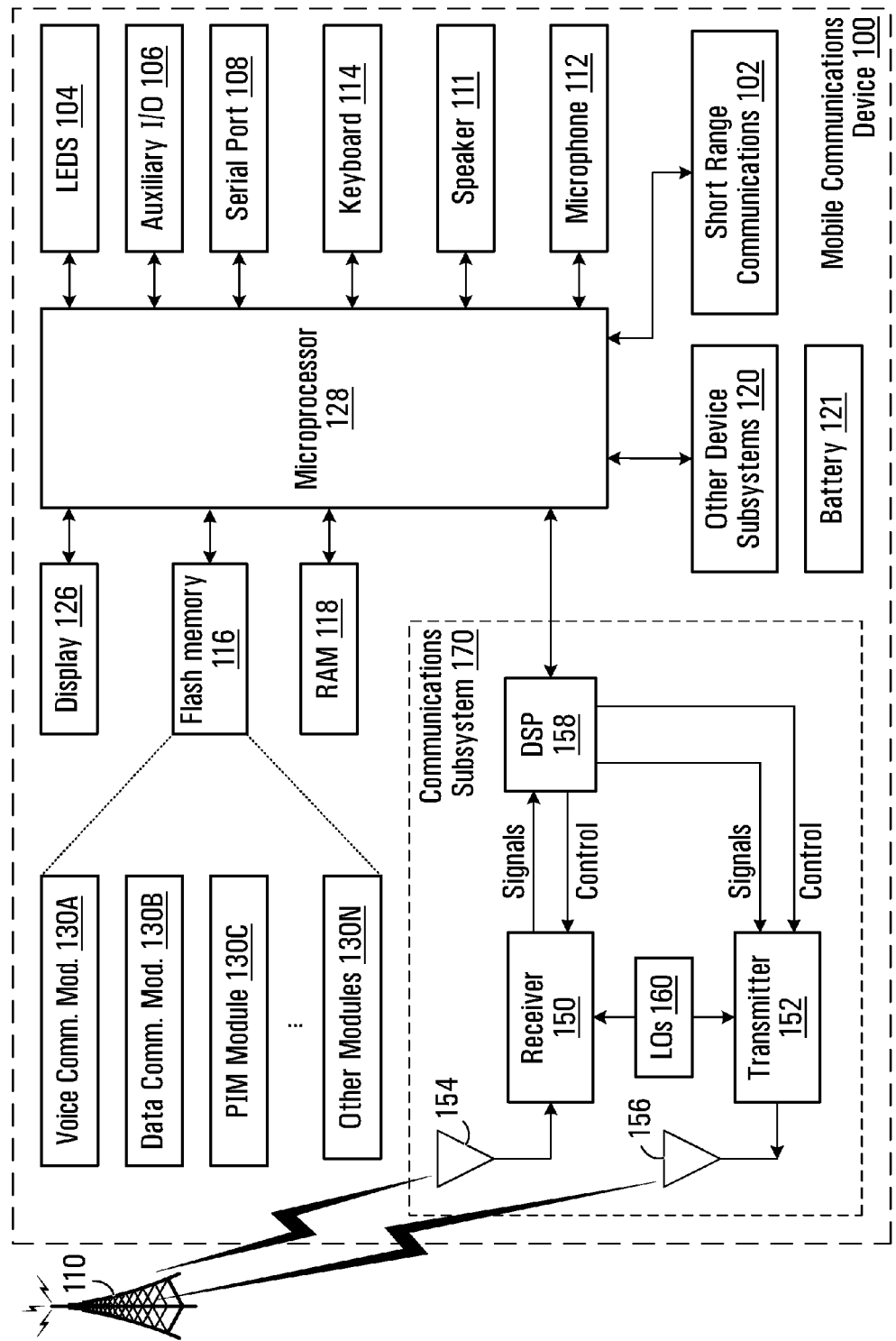
FIG. 10 is a block diagram of another wireless device.

Referring now to FIG. 10, shown is a block diagram of another wireless device 100 that may implement any of the wireless device methods described herein. The wireless device 100 is shown with specific components for implementing features described above, for example those generally illustrated in FIGS. 4 to 8. It is to be understood that the wireless device 100 is shown with very specific details for exemplary purposes only.

A processing device (a microprocessor 128) is shown schematically as coupled between a keyboard 114 and a display 126. The microprocessor 128 is a type of processor with features similar to those of the processor 920 of the wireless device 900 shown in FIG. 9. The microprocessor 128 controls operation of the display 126, as well as overall operation of the wireless device 100, in response to actuation of keys on the keyboard 114 by a user.

The wireless device 100 has a housing that may be elongated vertically, or may take on other sizes and shapes (including clamshell housing structures). The keyboard 114 may include a mode selection key, or other hardware or software for switching between text entry and telephony entry.

In addition to the microprocessor 128, other parts of the wireless device 100 are shown schematically. These include: a communications subsystem 170; a short-range communications subsystem 102; the keyboard 114 and the display 126, along with other input/output devices including a set of LEDs 104, a set of auxiliary I/O devices 106, a serial port 108, a speaker 111 and a microphone 112; as well as memory devices including a flash memory 116 and a Random Access Memory (RAM) 118; and various other device subsystems 120. The wireless device 100 may have a battery 121 to power the active elements of the wireless device 100. The wireless device 100 is in some embodiments a two-way radio frequency (RF) communication device having voice and data communication capabilities. In addition, the wireless device 100 in some embodiments has the capability to communicate with other computer systems via the Internet.

Operating system software executed by the microprocessor 128 is in some embodiments stored in a persistent store, such as the flash memory 116, but may be stored in other types of memory devices, such as a read only memory (ROM) or similar storage element. In addition, system software, specific device applications, or parts thereof, may be temporarily loaded into a volatile store, such as the RAM 118. Communication signals received by the wireless device 100 may also be stored to the RAM 118.

The microprocessor 128, in addition to its operating system functions, enables execution of software applications on the wireless device 100. A predetermined set of software applications that control basic device operations, such as a voice communications module 130A and a data communications module 130B, may be installed on the wireless device 100 during manufacture. In addition, a personal information manager (PIM) application module 130C may also be installed on the wireless device 100 during manufacture. The PIM application is in some embodiments capable of organizing and managing data items, such as e-mails, calendar events, voice mails, appointments, and task items. The PIM application is also in some embodiments capable of sending and receiving data items via a wireless network 110. In some embodiments, the data items managed by the PIM application are seamlessly integrated, synchronized and updated via the wireless network 110 with the device user's corresponding data items stored or associated with a host computer system. As well, additional software modules, illustrated as another software module 130N, may be installed during manufacture.

Communication functions, including data and voice communications, are performed through the communication subsystem 170, and possibly through the short-range communications subsystem 102. The communication subsystem 170 includes a receiver 150, a transmitter 152 and one or more antennas, illustrated as a receive antenna 154 and a transmit antenna 156. More generally, there may be more than one receive antenna or more than one transmit antenna, or both. In addition, the communication subsystem 170 also includes a processing module, such as a digital signal processor (DSP) 158, and local oscillators (LOs) 160. In some embodiments, the communication subsystem 170 includes a separate antenna arrangement (similar to the antennas 154 and 156) and RF processing chip/block (similar to the Receiver 150, LOs 160 and Transmitter 152) for each RAT, although a common baseband signal processor (similar to DSP 158) may be used for baseband processing for multiple RATs. The specific design and implementation of the communication subsystem 170 is dependent upon the communication network in which the wireless device 100 is intended to operate. For example, the communication subsystem 170 of the wireless device 100 may be designed to operate with the Mobitex™, DataTAC™ or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access (CDMA), Personal Communications Service (PCS), Global System for Mobile Communications (GSM), etc. Examples of CDMA include 1X and 1x EV-DO.

The communication subsystem 170 may also be designed to operate with an 802.11 Wi-Fi network, and/or an 802.16 WiMAX network. Other types of data and voice networks, both separate and integrated, may also be utilized with the wireless device 100.

Network access may vary depending upon the type of communication system. For example, in the Mobitex™ and DataTAC™ networks, wireless devices are registered on the network using a unique Personal Identification Number (PIN) associated with each device. In GPRS networks, however, network access is typically associated with a subscriber or user of a device. A GPRS device therefore typically has a subscriber identity module, commonly referred to as a Subscriber Identity Module (SIM) card, in order to operate on a GPRS network.

When network registration or activation procedures have been completed, the wireless device 100 may send and receive communication signals over the communication network 110. Signals received from the communication network 110 by the receive antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communication functions, such as demodulation and decoding. In a similar manner, signals to be transmitted to the network 110 are processed (e.g., modulated and encoded) by the DSP 158 and are then provided to the transmitter 152 for digital to analog conversion, frequency up conversion, filtering, amplification and transmission to the communication network 110 (or networks) via the transmit antenna 156.

In addition to processing communication signals, the DSP 158 provides for control of the receiver 150 and the transmitter 152. For example, gains applied to communication signals in the receiver 150 and the transmitter 152 may be adaptively controlled through receive and transmit gain control algorithms, respectively, implemented in the DSP 158.

In a data communication mode, a received signal, such as a text message or web page download, is processed by the communication subsystem 170 and is input to the microprocessor 128. The received signal is then further processed by the microprocessor 128 for an output to the display 126, or alternatively to some other auxiliary I/O devices 106. A device user may also compose data items, such as e-mail messages, using the keyboard 114 and/or some other auxiliary I/O device 106, such as a touchpad, a rocker switch, a thumb-wheel, or some other type of input device. The composed data items may then be transmitted over the communication network 110 via the communication subsystem 170.

In a voice communication mode, overall operation of the device is substantially similar to the data communication mode, except that received signals are output to a speaker 111, and signals for transmission are generated by a microphone 112. Alternative voice or audio I/O subsystems, such as a voice message recording subsystem, may also be implemented on the wireless device 100. In addition, the display 126 may also be utilized in voice communication mode, for example, to display the identity of a calling party, the duration of a voice call, or other voice call related information.

The short-range communications subsystem 102 enables communication between the wireless device 100 and other proximate systems or devices, which need not necessarily be similar devices. For example, the short range communications subsystem may include an infrared device and associated circuits and components, or a Bluetooth™ communication module to provide for communication with similarly-enabled systems and devices.

It should be understood that as used herein, terms such as coupled, connected, electrically connected, in signal communication, and the like may include direct connections between components, indirect connections between components, or both, as would be apparent in the overall context of a particular embodiment. The term coupled is intended to include, but not be limited to, a direct electrical connection.

Numerous modifications and variations of the present application are possible in light of the above teachings. It is therefore to be understood that within the scope of the appended claims, the embodiments of the application may be practised otherwise than as specifically described herein.

The invention claimed is:

1. A method for use in a receiver comprising:
receiving a signal over a plurality of time segments, the signal over each time segment comprising a plurality of resource element blocks;
for each time segment:
selecting at least one resource element block from the plurality of resource element blocks of the time segment based on information determined about the time segment;
determining a power value associated with the at least one resource element block of the time segment which comprises:
for each of the at least one resource element block, determining an average power value per resource element of the resource element block; and
determining the power value associated with the at least one resource element block by averaging all of the average power values per resource element for the at least one resource element block within the time segment, which further comprises:
determining if each of the at least one resource element blocks is an occupied resource element block by comparing the average power value per resource element for the resource element block to a threshold that defines an occupied resource element block; and
if the average power value per resource element for a resource element block is less than the threshold, not including the resource element block in the average when determining the power value; and
determining a gain adjustment value to adjust the gain of the time segment or one or more subsequent time segments based upon the power value associated with the at least one resource element block.

2. The method of claim 1, wherein the signal over each time segment comprises a plurality of orthogonal frequency division multiplexing (OFDM) symbols, each resource element block comprises a plurality of resource elements and each resource element comprises an OFDM symbol duration on an OFDM subcarrier.

3. The method of claim 1, further comprising converting the signal from time domain into frequency domain.

4. The method of claim 1, wherein determining the average power value per resource element for each at least one resource element block comprises:
for each of the at least one resource element block:
measuring the power of each resource element of the resource element block; and
determining the average power value per resource element for the resource element block by averaging the powers of the resource elements within the resource element block.

5. The method of claim 1, wherein determining the power value associated with the at least one resource element block of the time segment comprises determining the power value when the at least one resource element block is a portion of one of one or more pilots, a physical downlink control channel (PDCCH); a physical downlink shared channel (PDSCH); a physical control format indicator channel (PCFICH); a primary synchronization channel (PSS); a secondary synchronization channel (SSS); and a physical broadcast channel (PBCH).

6. The method of claim 1, further comprising determining information about the time segment by decoding physical control format indicator channel (PCFICH) information to determine how many OFDM symbol durations are carrying physical downlink control channel (PDCCH) information.

7. The method of claim 6, further comprising based on the PDCCH information, determining where physical downlink shared channels (PDSCH) are located in the time segment.

8. The method of claim 1, wherein determining the gain adjustment value further comprises determining a target power level based on Doppler frequency estimate and comparing the power level with the target power level for the gain adjustment.

9. The method of claim 8, wherein determining a target power level based on Doppler frequency estimate further comprises setting the target power level to a first value if the Doppler frequency estimate is equal to or less than a Doppler frequency estimate threshold and setting the target power level to a second value if the Doppler frequency estimate is large than the Doppler frequency estimate threshold.

10. A method for use in a receiver comprising:
receiving a signal over a plurality of time segments, the signal over each time segment comprising a plurality of resource element blocks;
for each time segment:
selecting at least one resource element block from the plurality of resource element blocks of the time segment based on information determined about the time segment;
determining a power value associated with the at least one resource element block of the time segment; and
determining a gain adjustment value to adjust the gain of the time segment or one or more subsequent time segments based upon the power value associated with the at least one resource element block,
further comprising determining information about the time segment by:
determining if there is any physical downlink shared channel (PDSCH) information for the receiver in the time segment;
if there is PDSCH information for the receiver, determining the location of the PDSCH information in the time segment; and
if there is no PDSCH information for the receiver and the receiver is configured to temporarily shut down if no PDSCH information is detected, determining how many resource elements in the resource element block are available for power measurement before the receiver temporarily shuts down for at least a remainder of the time segment.

11. The method of claim 10, further comprising, if there is no PDSCH information for the receiver and if the resource element block for which the power value is to be determined is the PDSCH;
for each of the at least one resource element block available for power measurement:
measuring the power of each resource element of the resource element block; and
determining an average power value per resource element for the resource element block by averaging the powers of the resource elements within the resource element block; and
determining if the resource element block is an occupied resource element block by comparing the average power value per resource element for the resource element block to a threshold that defines an occupied resource element block; and
determining the power value for the at least one resource element block by averaging all of the average power per resource element values for the at least one resource element block within the time segment.

12. A wireless device comprising a receiver, the wireless device comprising:
a processor;
a memory storing a gain adjustment function that when executed by the processor is configured to:
receive a signal over a plurality of time segments, the signal over each time segment comprising a plurality of resource element blocks;
for each time segment:
select at least one resource element block from the plurality of resource element blocks of the time segment based on information determined about the time segment;
determine a power value associated with the at least one resource element block of the time segment, which comprises:
for each of the at least one resource element block, determine an average power value per resource element of the resource element block; and
determine the power value associated with the at least one resource element block by averaging all of the average power values per resource element for the at least one resource element block within the time segment, which comprises:
when determining the power value associated with the at least one resource element block, determine if each of the at least one resource element blocks is an occupied resource element block by comparing the average power value per resource element for the resource element block to a threshold that defines an occupied resource element block; and
if the average power value per resource element for a resource element block is less than the threshold, not include the resource element block in the average when determining the power value; and
determine a gain adjustment value to adjust the gain of the time segment or one or more subsequent time segments based upon the power value associated with the at least one resource element block.

13. The wireless device of claim 12, wherein the signal over each time segment comprises a plurality of orthogonal frequency division multiplexing (OFDM) symbols, each resource element block comprises a plurality of resource elements and each resource element comprises an OFDM symbol duration on an OFDM subcarrier.

14. The wireless device of claim 12, wherein the gain adjustment function is further configured to convert the signal from time domain into frequency domain.

15. The wireless device of claim 12, wherein the gain adjustment function being configured to determine an average power value per resource element for the resource element block comprises the gain adjustment function being configured to:
for each of the at least one resource element block:
measure the power of each resource element of the resource element block; and
determine the average power value per resource element for the resource element block by averaging the powers of the resource elements within the resource element block.

16. The wireless device of claim 12, wherein the gain adjustment function is further configured to determine the power value when the at least one resource element block is a portion of one of:
one or more pilots; physical downlink control channel (PDCCH); a physical downlink shared channel (PDSCH); a physical control format indicator channel (PCFICH); a primary synchronization channel (PSS); a secondary synchronization channel (SSS); and a physical broadcast channel (PBCH).

17. The wireless device of claim 12, wherein the gain adjustment function is further configured to determine information about the time segment by decoding physical control format indicator channel (PCFICH) information to determine how many OFDM symbol durations are carrying physical downlink control channel (PDCCH) information.

18. The wireless device of claim 17, wherein the gain adjustment function is further configured to, for each time segment, based on the PDCCH information, determine where physical downlink shared channels (PDSCH) are located in the time segment.

19. A wireless device comprising a receiver, the wireless device comprising:
a processor;
a memory storing a gain adjustment function that when executed by the processor is configured to:
receive a signal over a plurality of time segments, the signal over each time segment comprising a plurality of resource element blocks;
for each time segment:
select at least one resource element block from the plurality of resource element blocks of the time segment based on information determined about the time segment;
determine a power value associated with the at least one resource element block of the time segment; and
determine a gain adjustment value to adjust the gain of the time segment or one or more subsequent time segments based upon the power value associated with the at least one resource element block,
wherein the gain adjustment function is further configured to, for each time segment determine information about the time segment such that the gain adjustment function is configured to:
determine if there is any physical downlink shared channel (PDSCH) information for the wireless device in the time segment;
if there is PDSCH information for the wireless device, determine the location of the PDSCH information in the time segment; and if there is no PDSCH information for the wireless device and the wireless device is configured to temporarily shut down if no PDSCH information is detected, determine how many resource elements in the resource element block are available for power measurement before the wireless device temporarily shuts down for at least a remainder of the time segment.

20. The wireless device of claim 19, wherein if there is no PDSCH information for the wireless device and if the at least one resource element block for which the power value is to be determined is the PDSCH, the gain adjustment function is configured to:

for each of the at least one resource element block available for power measurement:
measure the power of each resource element of the resource element block; and
determine an average power value per resource element for the resource element block by averaging the powers of the resource elements within the resource element block;
determine if the resource element block is an occupied resource element block by comparing the average power value per resource element for the resource element block to a threshold that defines an occupied resource element block; and determine the power value for the at least one resource element block by averaging all of the average power per resource element values for the at least one resource element block within the time segment.

* * * * *